United States Patent
Noh

(10) Patent No.: US 12,555,540 B2
(45) Date of Patent: Feb. 17, 2026

(54) DISPLAY APPARATUS

(71) Applicant: LG Display Co., Ltd., Seoul (KR)

(72) Inventor: Jun-Hwan Noh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/036,532

(22) Filed: Jan. 24, 2025

(65) Prior Publication Data

US 2025/0273149 A1    Aug. 28, 2025

(30) Foreign Application Priority Data

Feb. 28, 2024  (KR) ........................ 10-2024-0029107

(51) Int. Cl.
*G09G 3/32* (2016.01)
*G09G 3/3233* (2016.01)
*H10K 59/121* (2023.01)
*H10K 59/122* (2023.01)
*H10K 59/40* (2023.01)
*H10K 59/80* (2023.01)

(52) U.S. Cl.
CPC ....... *G09G 3/3233* (2013.01); *H10K 59/1213* (2023.02); *H10K 59/122* (2023.02); *H10K 59/40* (2023.02); *H10K 59/873* (2023.02); *G09G 2300/0413* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01)

(58) Field of Classification Search
CPC ... G09G 2300/0413; G09G 2300/0819; G09G 2300/0842; G09G 2300/0861; G09G 2310/08; G09G 2320/0233; G09G 3/3233; H10K 59/1213; H10K 59/122; H10K 59/40; H10K 59/873
See application file for complete search history.

(56) References Cited

U.S. PATENT DOCUMENTS

| | | | |
|---|---|---|---|
| 2012/0169578 A1* | 7/2012 | Kim ..................... | G09G 3/3648 345/93 |
| 2016/0225308 A1* | 8/2016 | Baek .................... | G09G 3/2022 |

* cited by examiner

*Primary Examiner* — Insa Sadio
(74) *Attorney, Agent, or Firm* — Morgan, Lewis & Bockius LLP

(57) ABSTRACT

In one or more examples, a display apparatus includes: a display panel including a display region in which a plurality of pixels are arranged, and a dummy scan region outside the display region; a plurality of first scan lines respectively arranged in a plurality of horizontal lines of the display region; a plurality of first scan stages respectively connected to the plurality of first scan lines; K dummy first scan lines respectively arranged in K horizontal lines of the dummy scan region, and each transmitting a dummy first scan signal; and K dummy first scan stages respectively connected to the K dummy first scan lines.

26 Claims, 10 Drawing Sheets

DISPLAY APPARATUS

CROSS REFERENCE TO RELATED APPLICATIONS

The present application claims the benefit of and priority to Korean Patent Application No. 10-2024-0029107 filed in Republic of Korea on Feb. 28, 2024, the entire contents of which are incorporated herein by reference for all purposes as if fully set forth herein.

1. TECHNICAL FIELD

The present disclosure relates to a display apparatus.

2. DESCRIPTION OF THE RELATED ART

As the information society develops, demand for display apparatuses for displaying images is increasing in various forms, and recently, various flat display apparatuses such as organic light emitting display apparatuses and liquid crystal display apparatuses are being utilized.

Here, the organic light emitting display apparatus is widely used because it has advantage of being small, lightweight, thin, and operating at low power.

The description of the related art should not be assumed to be prior art merely because it is mentioned in or associated with this section. The description of the related art includes information that describes one or more aspects of the subject technology, and the description in this section does not limit the invention.

SUMMARY

However, it is newly recognized by the inventors of the present disclosure that, in an organic light emitting display apparatus, when an anode reset voltage is provided to an anode electrode of a light emitting diode to initialize the anode electrode, a ripple may occur due to the anode reset voltage. In this case, a luminance may change due to the ripple, resulting in poor image quality in which a band-shaped mura is recognized. For example, the mura refers to a non-uniform visual defect that causes an uneven appearance in the brightness, color, or contrast of the display apparatus.

Therefore, the inventors of the present disclosure recognized the limitations mentioned above and other limitations associated with the related art, and conducted various experiments to implement a display apparatus that can prevent or reduce a ripple of the anode reset voltage and improve a band-shaped mura.

Additional features and aspects of the present disclosure will be set forth in the description which follows, and in part will be apparent from the description, or may be learned by practice of the disclosure. These and other aspects of the disclosure will be realized and attained by the structure particularly pointed out in the written description and claims hereof as well as the appended drawings.

To achieve these and other aspects and in accordance with the purpose of the present disclosure, as embodied and broadly described herein, in one or more aspects, a display apparatus includes: a display panel including a display region in which a plurality of pixels are arranged, and a dummy scan region outside the display region; a plurality of first scan lines respectively arranged in a plurality of horizontal lines of the display region; a plurality of first scan stages respectively connected to the plurality of first scan lines; K dummy first scan lines respectively arranged in K horizontal lines of the dummy scan region, and each transmitting a dummy first scan signal, where K is a positive integer; and K dummy first scan stages respectively connected to the K dummy first scan lines wherein the dummy first scan signal precedes a first scan signal of a first horizontal line among the plurality of horizontal lines.

In one or more aspects, a display apparatus includes: a display panel including a display region and a dummy scan region outside the display region; a first scan stage outputting a first scan signal applied to a pixel in the display region; and a dummy first scan stage outputting a dummy first scan signal having same pulse period as the first scan signal, to the dummy scan region, wherein the dummy first scan signal precedes the first scan signal of a first horizontal line, wherein for a scan pulse of the first scan signal, an end edge and a start edge are positioned at the same time at an interval of m horizontal lines, and wherein among a plurality of dummy first scan stages, m dummy first scan stages from a last dummy first scan stage are activated to output the dummy first scan signal with the same interval of m horizontal lines.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. Further aspects and advantages are discussed below in conjunction with example embodiments of the disclosure.

According to example embodiments of the present disclosure, the ripples in the anode reset voltage due to the toggling of the first and fourth scan signals in the upper area of the display area, which corresponds to the initial scan section, can be prevented or reduced, and the image quality can be improved by minimizing, preventing or reducing the occurrence of mura due to the ripples in the anode reset voltage in the portion of the display area where the third scan signal is applied in the initial scan section of the first and fourth scan signals.

According to example embodiments of the present disclosure, by minimizing, preventing or reducing the occurrence of mura due to the ripples in the anode reset voltage, the display apparatus can be driven with high efficiency and low power.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the present disclosure, are incorporated in and constitute a part of this present disclosure, illustrate aspects and embodiments of the present disclosure, and together with the description serve to explain principles and examples of the disclosure. In the drawings.

Figure 1:
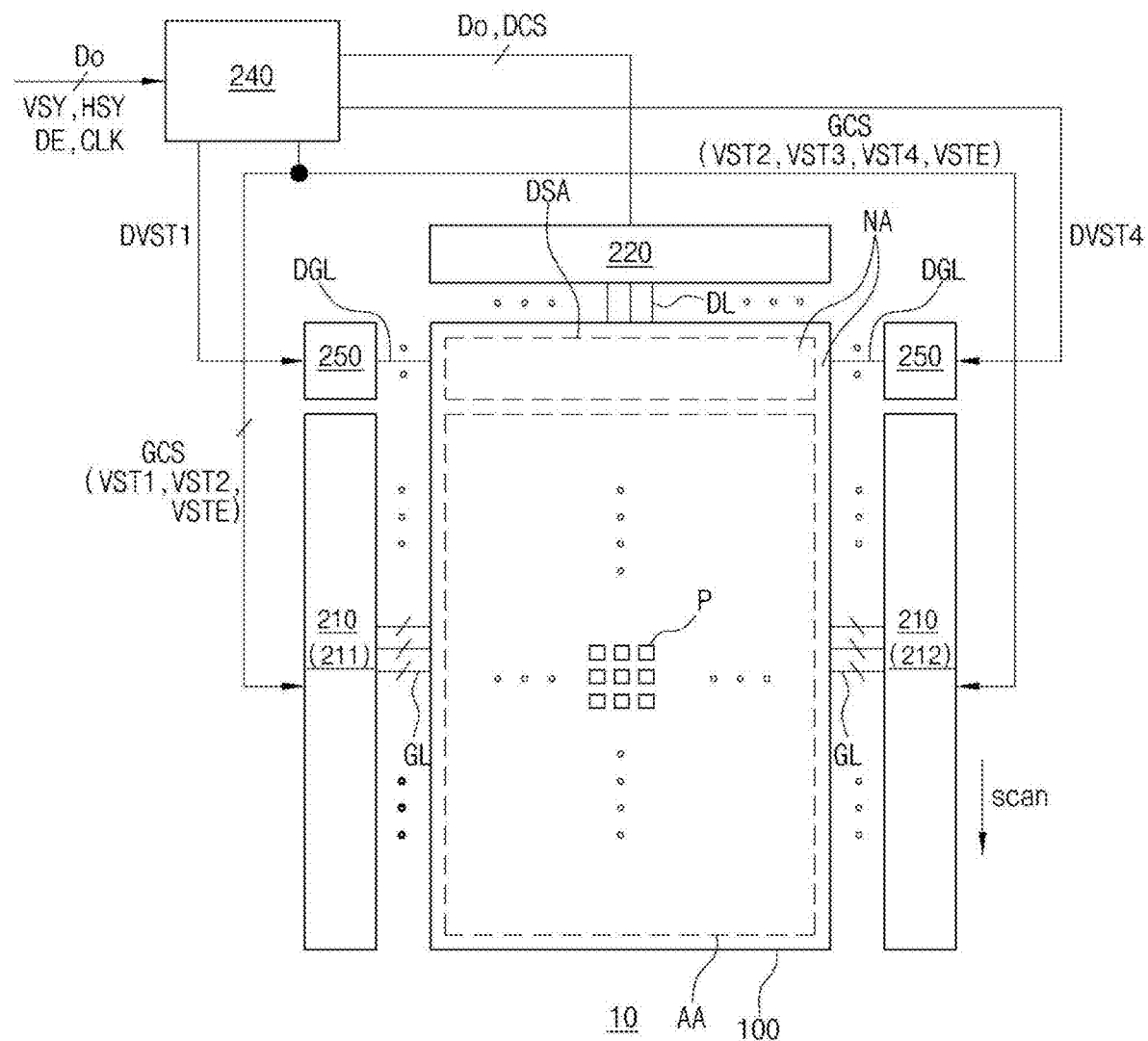
FIG. 1 is a view illustrating a display apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure and methods of achieving them will be apparent with reference to the example embodiments described below in detail with the accompanying drawings. However, the present disclosure is not limited to the example embodiments disclosed below, but can be realized in a variety of different forms, and these embodiments are provided such that the present disclosure is complete. The present disclosure is provided to fully inform the scope of the disclosure to the skilled in the art of the present disclosure, and the present disclosure may be defined by the scope of the appended claims.

The shapes, sizes, proportions, angles, numbers, and the like disclosed in the drawings for explaining the embodiments of the present disclosure are illustrative, and the present disclosure is not limited to the illustrated matters. The same reference numerals refer to the same components throughout the description, unless otherwise specified.

Furthermore, in describing the present disclosure, if it is determined that a detailed description of the related known technology unnecessarily obscure the subject matter of the present disclosure, the detailed description thereof can be omitted or briefly provided. When terms such as 'comprising', 'including', 'having', 'consisting', 'formed of', and the like are used in this disclosure, other parts can be added unless 'only' is used. When a component is expressed in the singular, cases including the plural are included unless specific statement is described. Any implementation described herein as an "example" is not necessarily to be construed as preferred or advantageous over other implementations. The word "exemplary" is used to mean serving as an example or illustration. Embodiments are example embodiments. Aspects are example aspects. In one or more implementations, "embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In interpreting the components, even if there is no separate explicit description, it is interpreted as including a margin range, an error range or a tolerance range.

In the case of a description of a positional relationship, for example, when the positional relationship of two parts is described using "on," "over," "under," "above," "below," "beneath," "near," "close to," or "adjacent to," "beside," "next," or the like, one or more other parts may be located between the two parts unless a more limiting term, such as "immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed or interposed therebetween. Furthermore, the terms "left," "right," "top," "bottom," "downward," "upward," "upper," "lower," and the like refer to an arbitrary frame of reference.

In the case of a description of a temporal relationship, for example, when a temporal precedence is described as 'after', 'following', 'before', 'next', and the like, cases that are not continuous can be included unless a more limiting term, such as 'just', 'directly' or 'immediately' is used.

In describing components of the present disclosure, terms such as first, second, A, B, (a), (b), and the like can be used. These terms are only for distinguishing the components from other components, and an essence, order, order, or number of the components is not limited by the terms. For example, a first element could be termed a second element, and, similarly, a second element could be termed a first element, without departing from the scope of the present disclosure.

The term "at least one" should be understood to include all combinations of one or more of related elements. For example, the term of "at least one of first, second and third elements" may include all combinations of two or more of the first, second and third elements as well as the first, second or third element.

The transistor of the present disclosure can include one of an oxide thin film transistor, an amorphous silicon thin film transistor, a low temperature polycrystalline silicon thin film transistor, and the present disclosure is not limited thereto.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" can apply, for example, to a separate circuit or structure, an integrated circuit, a computational block of a circuit device, or any structure configured to perform a described function as should be understood to one of ordinary skill in the art.

Respective features of various example embodiments of the present disclosure can be partially or wholly connected to or combined with each other and can be technically interlocked and driven variously, and respective embodiments can be independently implemented from each other or can be implemented together with a related relationship.

Hereinafter, various example embodiments of the present disclosure are described in detail with reference to the drawings. In addition, in the following embodiments, the same and like reference numerals are assigned to the same and like components, and detailed descriptions thereof may be omitted.

Figure 2:
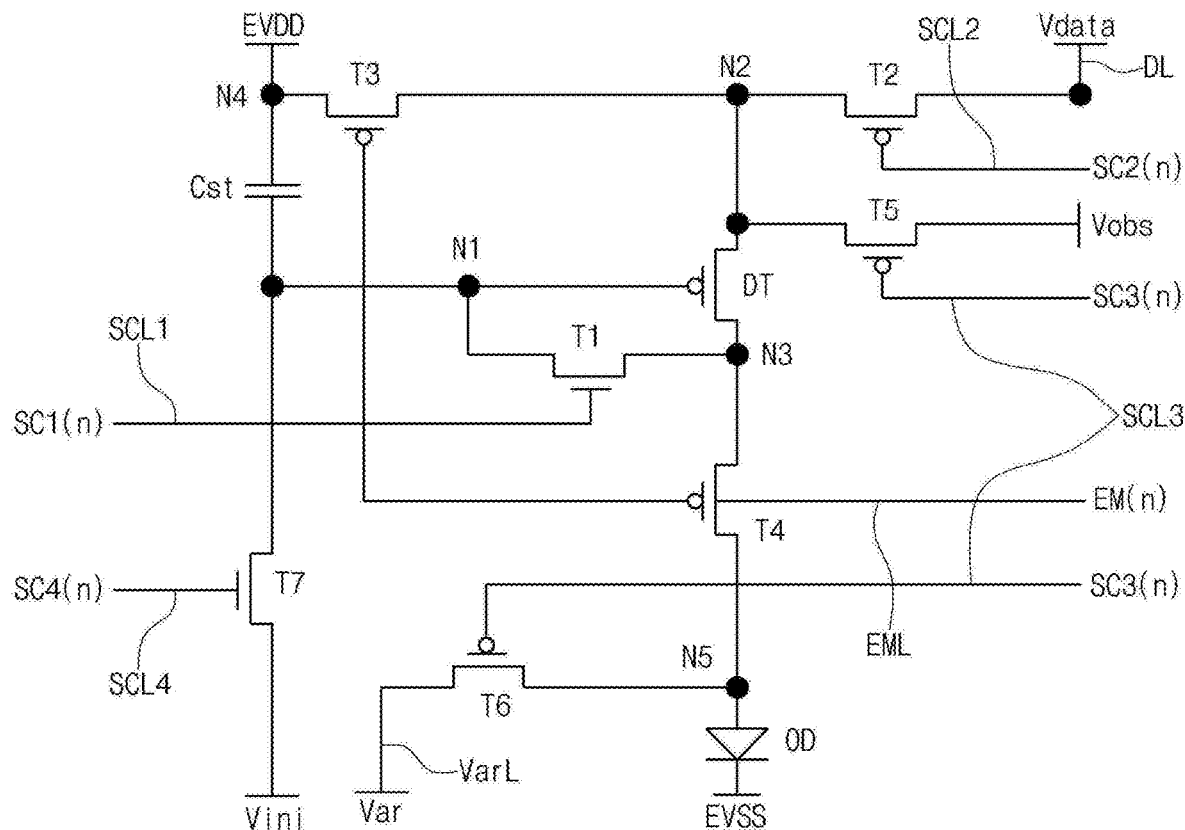
FIG. 2 is a circuit diagram illustrating an example of a pixel according to an example embodiment of the present disclosure.
Figure 3:
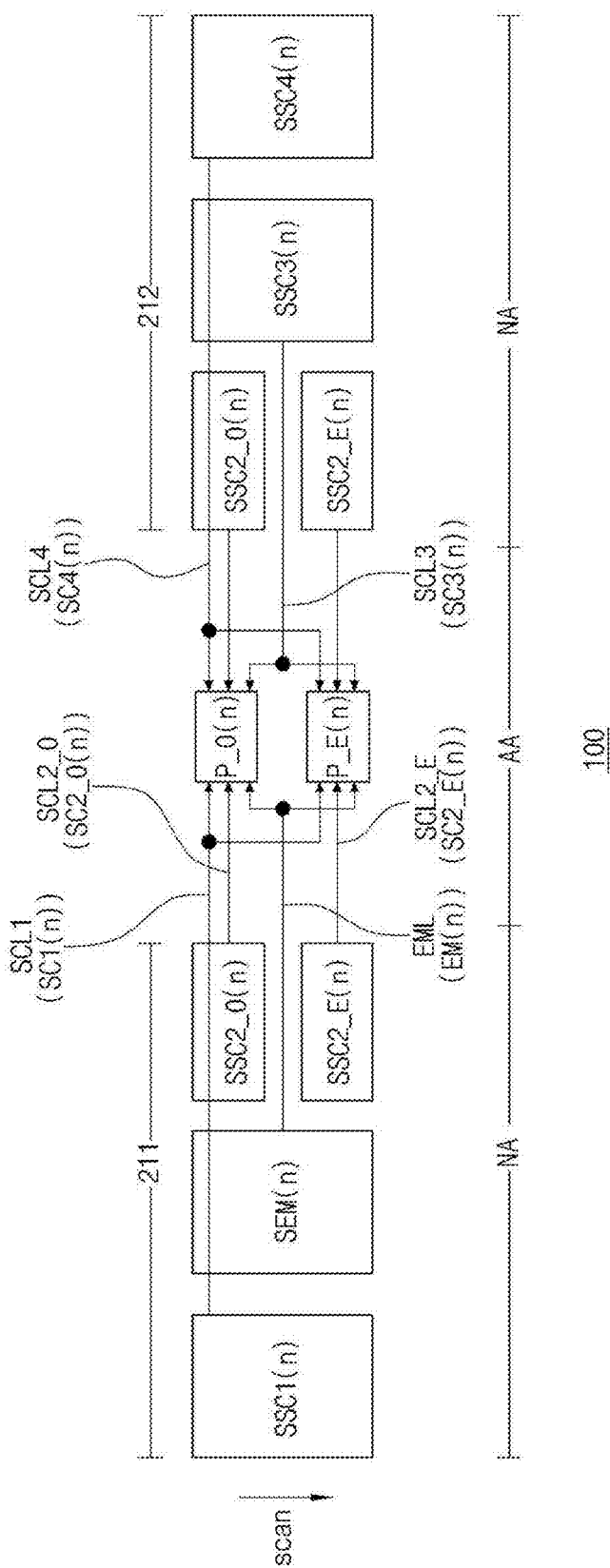
FIG. 3 is a block diagram illustrating a configuration of a gate driving portion of a display apparatus according to an example embodiment of the present disclosure.

FIG. 1 is a view illustrating a display apparatus according to an embodiment of the present disclosure. FIG. 2 is a circuit diagram illustrating an example of a pixel according to an embodiment of the present disclosure. FIG. 3 is a block diagram illustrating a configuration of a gate driving portion of a display apparatus according to an embodiment of the present disclosure.

Prior to a specific description, the display apparatus 10 according to the present embodiment can be one of all types of display apparatuses, including a light emitting display apparatus having a light emitting diode, in which a ripple of an anode reset voltage can be induced by toggling of first and/or fourth scan signals in an initial scan period of the display region AA.

For convenience of explanation, in the present disclosure, an organic light emitting display apparatus is described as an example of the display apparatus 10, but embodiments of the present disclosure are not limited thereto.

Referring to FIGS. 1 to 3, the display apparatus 10 of the present disclosure can include a display panel 100 and a driving circuit portion for driving the display panel 100.

The driving circuit portion can include, for example, a gate driving portion (or gate driving circuit) 210, a data driving portion (or data driving circuit) 220, and a timing control portion (or timing control circuit) 240, embodiments of the present disclosure are not limited thereto. The driving circuit portion can include a dummy gate driving portion (or a dummy gate driving circuit) 250.

The display panel 100 can include a display region AA, and a non-display region NA arranged outside the display region AA. The non-display region NA can be located around the display region AA. In another example, the non-display region NA may be disposed to be adjacent to the display region AA.

The display region AA can display an image. In the display region AA, a plurality of pixels P can be arranged along a plurality of horizontal lines (or row lines) and a plurality of vertical lines (or column lines). For example, the plurality of pixels P can be arranged in a matrix form along the plurality of horizontal lines (or row lines) and the plurality of vertical lines (or column lines), but embodiments of the present disclosure are not limited thereto.

The plurality of pixels P can include pixels (or sub-pixels) that display different colors, for example, red, green, and blue pixels (or sub-pixels) that display red, green, and blue, respectively, but not limited thereto.

In the display panel 100, various signal lines that transmit driving signals for driving the pixels P can be formed on a substrate.

For example, a plurality of data lines DL that transmit data signals (or data voltages), which are image signals, can extend in the vertical direction and be connected to the pixels P of the respective vertical lines.

A gate line GL transmitting a gate signal (or gate voltage) can be extended along the horizontal direction and be connected to the pixels P of the corresponding horizontal line.

In the present disclosure, a plurality of gate signals can be used to drive each pixel P, for example, first scan signal SC1 to fourth scan signal SC4 and an emission control signal EM can be used. Accordingly, a plurality of gate lines GL respectively transmitting the plurality of gate signals can be used, for example, first scan line SCL1 to fourth scan line SCL4 and an emission control line EML can be used. The plurality of gate signals and gate lines GL are described in more detail below.

The plurality of pixels P can be defined by the plurality of data lines DL and/or gate lines GL, but embodiments of the present disclosure are not limited thereto.

Each pixel P can include a light emitting diode OD as a light emitting element, and a plurality of transistors and at least one capacitor for driving the light emitting diode OD, but embodiments of the present disclosure are not limited thereto.

In the present disclosure, for convenience of explanation, an 8T1C structure in which the pixel P is provided with eight transistors T1 to T7 and DT and one capacitor Cst as illustrated in FIG. 2 is taken as an example, but embodiments of the present disclosure are not limited thereto. For example, 3T1C, 4T1C, 5T1C, 3T2C, 4T2C, 5T2C, 6T1C, 6T2C, 7T1C, 7T2C, 8T2C structures, etc. are also possible. And more or less transistors and/or capacitors could be included.

Referring to FIG. 2, the pixel P can include a plurality of switching transistors for example, first transistor T1 to seventh transistor T7, a driving transistor DT, a storage capacitor Cst, and the light emitting diode OD, but embodiments of the present disclosure are not limited thereto.

Each of the first to seventh transistors T1 to T7 and the driving transistor DT can include a first electrode, a second electrode, and a gate electrode. One of the first electrode and the second electrode can be a source electrode, and the other of the first electrode and the second electrode can be a drain electrode. However, since the source electrode and the drain electrode can be changed according to an applied voltage, the source electrode and the drain electrode of the transistor are not fixed.

Each of the first to seventh transistors T1 to T7 and the driving transistor DT can be a P-type or N-type transistor. In FIG. 2, a case in which the second, third, fourth, fifth, and sixth transistors T2, T3, T4, T5, and T6 are configured as P-type transistors, the first and seventh transistors T1 and T7 are configured as N-type transistors, and the driving transistor DT is configured as a P-type transistor, but not limited thereto. For example, one of the first to seventh transistors T1 to T7 and the driving transistor DT can be configured of one of the P-type and N-type transistors or a combination thereof.

The first transistor T1 to the seventh transistor T7 and the driving transistor DT can include semiconductors of the same material or may include semiconductors of different materials. In this regard, for example, some of the first transistor T1 to the seventh transistor T7 and the driving transistor DT can have one semiconductor layer among a low temperature polycrystalline silicon layer, a polycrystalline silicon layer, an oxide semiconductor layer, and an amorphous silicon layer, and another some of the first transistor T1 to the seventh transistor T7 and the driving transistor DT can have another semiconductor layer among a low temperature polycrystalline silicon layer, a polycrystalline silicon layer, an oxide semiconductor layer, and an amorphous silicon layer, but embodiments of the present disclosure are not limited thereto.

Since an oxide semiconductor has excellent off-current characteristics and thus can have characteristics suitable for a switching transistor, at least one of the first transistor T1 to the seventh transistor T7 can have an oxide semiconductor layer. In addition, since polycrystalline silicon or low temperature polycrystalline silicon has excellent mobility, the driving transistor DT can have a polycrystalline silicon layer or a low temperature polycrystalline silicon layer. However, the present disclosure is not limited thereto, and the first transistor T1 to the seventh transistor T7 and the driving transistor DT can be configured in another form. For example, one of the first to seventh transistors T1 to T7 and the driving transistor DT can be configured of one or a combination of an oxide semiconductor layer, a polycrystalline silicon semiconductor layer, and a low temperature polycrystalline silicon semiconductor layer.

The gate signals provided to a n-th horizontal line (more specifically, at least one of a n-th odd horizontal line and a n-th even horizontal line constituting the n-th horizontal line) of FIG. 2 can be provided from a corresponding n-th stage of the gate driving portion 210. For example, four scan signals for example, first to fourth scan signals (SC1 to SC4: SC1($n$) to SC4($n$)) and an emission control signal (EM: EM(n)) can be provided. In this case, in the display region AA, first to fourth scan lines SCL1 to SCL4 and an emission control line EML that are connected to the n-th stage and transmit the first to fourth scan signals SC1($n$) to SC4($n$) and the emission control signal EM(n) to the pixel P can be arranged.

The first transistor T1 can function as a sampling transistor, the second transistor T2 can function as a data supply transistor, the third and fourth transistors T3 and T4 can each function as an emission control transistor, the fifth transistor T5 can function as a bias transistor, the sixth transistor T6 can function as a reset transistor, and the seventh transistor T7 can function as an initialization transistor, but embodiments of the present disclosure are not limited thereto.

The light emitting diode OD can include an anode electrode and a cathode electrode. The anode electrode of the light emitting diode OD can be connected to a fifth node N5, and the cathode electrode of the light emitting diode OD can be applied with a low-potential driving voltage EVSS.

The driving transistor DT can include a first electrode connected to a second node N2, a second electrode connected to a third node N3, and a gate electrode connected to a first node N1. The driving transistor DT can provide a driving current (or an emission current) to the light emitting diode OD based on a voltage of the first node N1 (e.g., the data voltage Vdata stored in the storage capacitor Cst). For example, the driving transistor DT can be connected between the second node N2 and the third node N3.

The first transistor T1 can include a first electrode connected to the first node N1, a second electrode connected to the third node N3, and a gate electrode receiving the first scan signal SC1($n$). The first transistor T1 can be turned on in response to the first scan signal SC1($n$), and the data voltage Vdata can be applied (or written or sampled) to the gate electrode of the driving transistor DT. For example, the first transistor T1 can be connected between the first node N1 and the third node N3.

The storage capacitor Cst can be connected between the first node N1 and a fourth node N4. The storage capacitor Cst can store or maintain a high-potential driving voltage EVDD provided thereto.

The second transistor T2 can include a first electrode connected to the data line DL (or receiving the data voltage Vdata), a second electrode connected to the second node N2, and a gate electrode receiving the second scan signal SC2($n$). The second transistor (T2) can be turned on in response to the second scan signal SC2($n$) and transmit the data voltage Vdata to the second node N2. For example, the second transistor T2 can be connected between the second node N2 and the data line DL.

The third transistor T3 and the fourth transistor T4 (or first and second emission control transistors) can be connected between a power wiring of the high-potential driving voltage EVDD and the light emitting diode OD, and can form a current path along which the driving current generated by the driving transistor DT moves.

The third transistor T3 can include a first electrode connected to the fourth node N4 and receiving the high-potential driving voltage EVDD, a second electrode connected to the second node N2, and a gate electrode receiving the emission control signal EM(n). For example, the third transistor T3 can be connected between the second node N2 and the power line of the high-potential driving voltage EVDD.

The fourth transistor T4 can include a first electrode connected to the third node N3, a second electrode connected to the fifth node N5 (or the anode electrode of the light emitting diode OD), and a gate electrode receiving the emission control signal EM(n). For example, the fourth transistor T4 can be connected between the third node N3 and the fifth node N5.

The third and fourth transistors T3 and T4 can be turned on in response to the emission control signal EM(n), and the driving current can be provided to the light emitting diode OD, and the light emitting diode OD can emit light with a luminance corresponding to the driving current.

The fifth transistor T5 can include a first electrode receiving a bias voltage Vobs, a second electrode connected to the second node N2, and a gate electrode receiving the third scan signal SC3($n$). For example, the fifth transistor T5 can be connected between the second node N2 and a line transmitting the bias voltage Vobs.

The sixth transistor T6 can include a first electrode receiving an anode reset voltage Var, a second electrode connected to the fifth node N5, and a gate electrode receiving the third scan signal SC3($n$).

The sixth transistor T6 can include a first electrode connected to a voltage line VarL that transmits an anode reset voltage Var, a second electrode connected to the fifth node N5, and a gate electrode that receives the third scan signal SC3(n). For example, the sixth transistor T6 can be connected between the fifth node N5 and the voltage line VarL.

The fifth and sixth transistors T5 and T6 can be turned on in response to the third scan signal SC3(n), and the bias voltage Vobs can be applied to the second node N2 and the anode reset voltage Var can be applied to the fifth node N5 (for example, the anode electrode of the light-emitting diode OD).

The seventh transistor T7 can include a first electrode receiving an initialization voltage Vini, a second electrode connected to the first node N1, and a gate electrode receiving a fourth scan signal SC4(n). For example, the seventh transistor T7 can be connected between the first node N1 and a line transmitting the initialization voltage Vini.

The seventh transistor T7 can be turned on in response to the fourth scan signal SC4(n) and initialize a gate electrode of the driving transistor DT using the initialization voltage Vini. Unnecessary charges can remain in the gate electrode of the driving transistor DT due to the high-potential driving voltage EVDD applied to the storage capacitor Cst. Therefore, an amount of the remaining charges can be initialized by applying the initialization voltage Vini to the gate electrode of the driving transistor DT through the seventh transistor T7.

The 8T1C structure of the pixel P described above is an example, and the pixel P of the present disclosure can be configured with a different structure.

Referring to FIG. 1 again, the gate driving portion 210 can receive a gate control signal GCS from the timing control portion 240, generate the gate signals, and sequentially apply the gate signals to the plurality of gate lines GL. For example, the gate signals can be sequentially output in the vertical direction from the top to the bottom.

The gate driving portion 210 can be arranged, for example, on at least one side of the display region AA, but embodiments of the present disclosure are not limited thereto. In the present disclosure, a case in which the gate driving portion 210 is configured to include first and second gate driving portions 211 and 212 arranged on both sides of the display region AA is taken as an example, but embodiments of the present disclosure are not limited thereto.

The gate driving portion 210 can be formed directly in the non-display region NA on a substrate of the display panel 100 in a form of, for example, a GIP (gate-in panel) structure, and in this case, the gate driving portion 210 can be formed in processes of forming elements of the display panel 100. As another example, the gate driving portion 210 can be configured to include at least one gate IC.

The gate driving portion 210 configured in the GIP structure can include, for example, a first scan driving circuit that sequentially outputs the first scan signals SC1, a second scan driving circuit that sequentially outputs the second scan signals SC2, a third scan driving circuit that sequentially outputs the third scan signals SC3, a fourth scan driving circuit that sequentially outputs the fourth scan signal SC4, an emission driving circuit that sequentially outputs the emission control signals EM, but embodiments of the present disclosure are not limited thereto.

Each of the first scan driving circuit to the fourth scan driving circuit and the emission driving circuit can be configured with a shift register including a plurality of stages that output respective signals.

Figure 4:
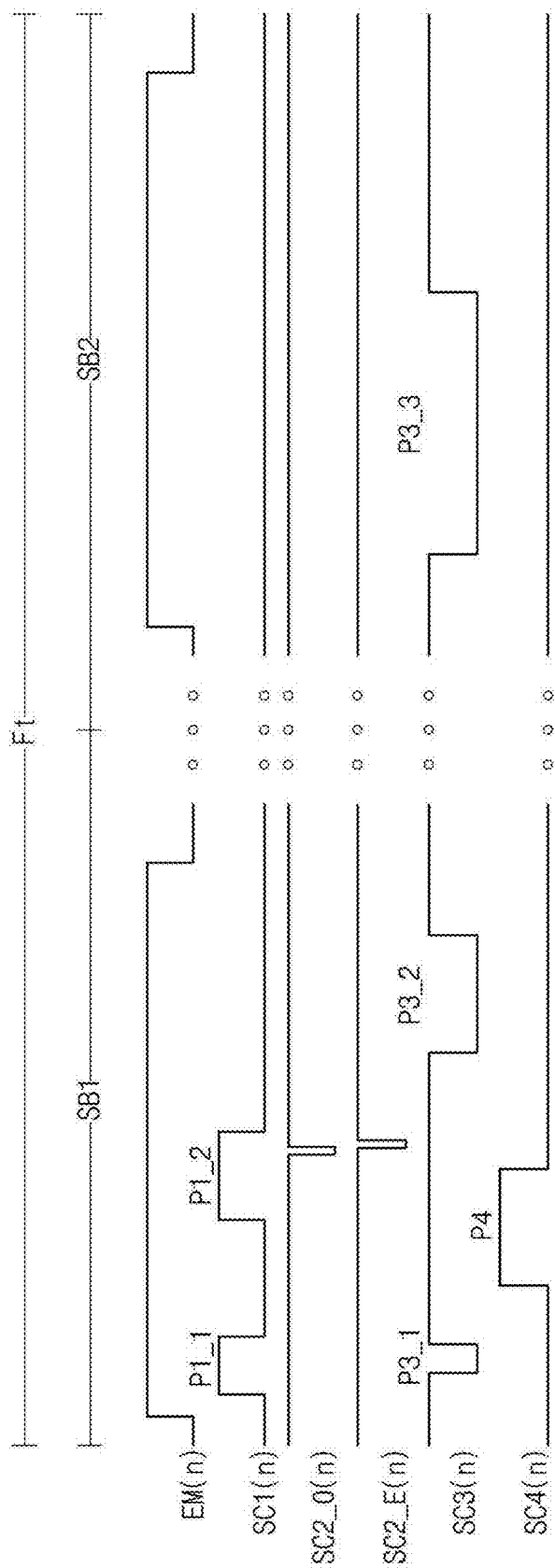
FIG. 4 is a view illustrating timings of first scan signal to fourth scan signal and an emission control signal output to a display panel according to an example embodiment of the present disclosure.

The gate driving portion 210 and the gate signals are described with further reference to FIGS. 3 and 4. FIG. 3 illustrates a part of the gate driving portion 210, and for convenience of explanation, a configuration of a portion of the gate driving portion 210 that drives the n-th horizontal line configured with a n-th odd horizontal line (or 2n-1-th horizontal line) and a n-th even horizontal line (or 2n-th horizontal line) of the display region AA is illustrated as an example, but embodiments of the present disclosure are not limited thereto. FIG. 4 illustrates the timings of the first scan signal SC1(n) to the fourth scan signal SC4(n) and the emission control signal EM(n) which are gate signals output to the n-th horizontal line.

In the first gate driving portion 211 of the gate driving portion 210, for example, a first scan stage SSC1(n) constituting the first scan driving circuit, an emission stage SEM(n) constituting the emission driving circuit, and odd and even second scan stages SSC2_O(n) and SSC2_E(n) constituting the second scan driving circuit can be arranged.

In the second gate driving portion 212 of the gate driving portion 210, for example, a third scan stage SSC3(n) constituting the third scan driving circuit, a fourth scan stage SSC4(n) constituting the fourth scan driving circuit, and odd and even second scan stages SSC2_O(n) and SSC2_E(n) constituting the second scan driving circuit can be arranged.

The arrangement of the first to fourth scan stages SSC1(n) to SSC4(n) and the emission stage SEM(n) shown in FIG. 3 is an example, and they can be arranged in various combinations in the first and second gate driving portions 211 and 212.

The first scan stage SSC1(n) can generate the first scan signal SC1(n) and output the first scan signal SC1(n) to the corresponding first scan line SCL1. Accordingly, the pixel P_O(n) of the n-th odd horizontal line and the pixel P_E(n) of the n-th even horizontal line can be commonly applied with the first scan signal SC1(n).

The odd second scan stage SSC2_O(n) can generate an odd second scan signal SC2_O(n) and output the odd second scan signal SC2_O(n) to the corresponding odd second scan line SCL2_O. The even second scan stage SSC2_E(n) can generate an even second scan signal SC2_E(n) and output it to the corresponding even second scan line SCL2_E. Accordingly, the pixel P_O(n) of the n-th odd horizontal line can be applied with the odd second scan signal SC2_O(n), and the pixel P_E(n) of the n-th even horizontal line can be applied with the even second scan signal SC2_E(n). The odd second scan signal SC2_O(n) and the even second scan signal SC2_E(n) can have different timings. For example, the odd second scan signal SC2_O(n) and the even second scan signal SC2_E(n) can be applied in a data writing period of the n-th odd horizontal line and in a data writing period of the n-th even horizontal line immediately following it, respectively.

The third scan stage SSC3(n) can generate the third scan signal SC3(n) and output the third scan signal SC3(n) to the corresponding third scan line SCL3. Accordingly, the pixels P_O(n) and P_E(n) of the n-th odd and even horizontal lines can commonly receive the third scan signal SC3(n).

The fourth scan stage SSC4(n) can generate the fourth scan signal SC4(n) and output the fourth scan signal SC4(n) to the corresponding fourth scan line SCL4. Accordingly, the pixels P_O(n) and P_E(n) of the n-th odd and even horizontal lines can commonly receive the fourth scan signal SC4(n).

The emission stage SEM(n) can generate the emission control signal EM(n) and output the emission control signal EM(n) to the corresponding emission control line EML. Accordingly, the pixels P_O(n) and P_E(n) of the n-th odd and even horizontal lines can commonly receive the emission control signal EM(n).

The first to fourth scan signals SC1(n) to SC4(n) and the emission control signal EM(n) applied to the n-th horizontal line are described with further reference to FIG. 4.

A frame period Ft corresponding to a driving cycle of the n-th horizontal line can include, for example, a first period (or first sub-frame period) SB1 as a first half period and a second period (or second sub-frame period) SB2 as a second half period.

In this case, a data writing process can be performed in the first period SB1 of the frame period Ft. To this end, in the first period SB1, the first to fourth scan signals SC1(n) to SC4(n) that drive the first to seventh transistors T1 to T7 of the pixels P_O(n) and P_E(n) arranged in the n-th horizontal line can be applied.

For example, during a period, within the first period SB1, when the emission control signal EM(n) is in an off level, for example, the emission control signal EM(n) of a high-level scan pulse is applied and thus the light emitting diode OD is in a non-emission state, the first scan signal (SC1(n)) can have an on-level, for example, a high-level scan pulse. For example, two scan pulses for example, first and second scan pulses P1_1 and P1_2 can be applied at a certain interval.

In addition, during a non-emission state period within the first period (SB1), the third scan signal SC3(n) can have an on state, for example, a low-level scan pulse. For example, two scan pulses, first and second scan pulses P3_1 and P3_2 can be applied at a certain interval. The first scan pulse P3_1 of the third scan signal SC3(n) can be positioned corresponding to the first scan pulse P1_1 of the first scan signal SC1(n), and the second scan pulse P3_2 of the third scan signal SC3(n) can be positioned after the second scan pulse P1_2 of the first scan signal SC1(n).

Within the non-emission state period of the first period SB1, the second scan signals SC2_O(n) and SC2_E(n) can each have a scan pulse of an on level, for example, a low level. For example, the scan pulse of the even second scan signal SC2_E(n) can be positioned consecutively after the scan pulse of the odd second scan signal SC2_O(n). The scan pulses of the second scan signal SC2_O(n) and SC2_E (n) can be located within the second scan pulse P1_2 of the first scan signal SC1(n), and more specifically, can be located in a section of the second scan pulse P1_2 of the first scan signal SC1(n) that does not overlap with a scan pulse P4 of the fourth scan signal SC4(n).

In the non-emission state period within the first period SB1, the fourth scan signal SC4(n) can have the scan pulse P4 of an on level, for example, a high level. The scan pulse P4 of the fourth scan signal SC4(n) can overlap a part of a front portion of the second scan pulse P1_2 of the first scan signal SC1(n).

According to the present disclosure, after the first to fourth scan signals SC1(n) to SC4(n) are applied within the first period SB1 to perform the process of writing the data voltage Vdata to each of the pixels P_O(n) and P_E(n), the emission control signal EM(n) can be switched to a low level, which is an on level, and thus the light emitting diode D can be in an emission state.

After the first period SB1 ends, in the second period SB2 of the frame period Ft, an anode reset process for applying the anode reset voltage Var can be performed.

For example, in the second period SB2, the emission control signal EM(n) can be applied with a high-level scan pulse, and thus the light emitting diode OD can be in a non-emission state, and in this non-emission state period, the third scan signal SC3(n) can have a third scan pulse P3_3. In addition, the first scan signal SC1(n), the second scan signals SC2_O(n) and SC2_E(n), and the fourth scan signal SC4(n) can have an off level. Accordingly, the anode reset voltage Var can be applied to perform the anode reset.

As described above, after the third scan signal SC3(n) is applied within the second period SB2 to perform the anode reset process, the emission control signal EM(n) can be switched to a low level, which is an on level, and thus the light emitting diode OD can be in an emission state.

Figure 5:
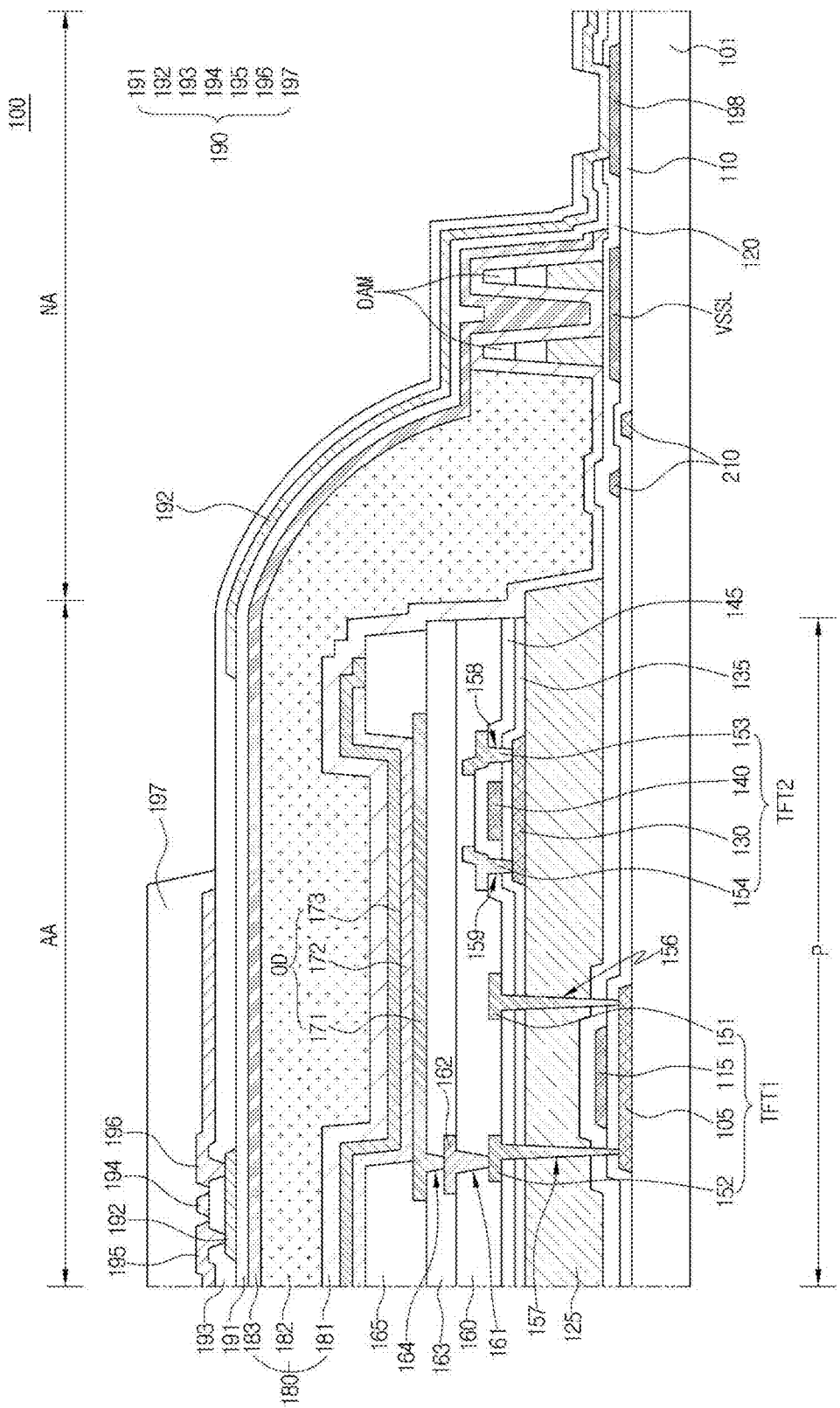
FIG. 5 is a cross-sectional view schematically illustrating an example of a cross-sectional structure of a display panel according to an example embodiment of the present disclosure.

An example of a cross-sectional structure of the display panel 100 of the present disclosure is described with further reference to FIG. 5. FIG. 5 is a cross-sectional view schematically illustrating an example of a cross-sectional structure of a display panel according to an embodiment of the present disclosure.

In FIG. 5, for convenience of explanation, two thin film transistors TFT1 and TFT2 are illustrated in the pixel P within the display region AA, but embodiments of the present disclosure are not limited thereto. Here, the thin film transistor TFT1 positioned relatively lower and closer to the substrate 101 is referred to as a first thin film transistor TFT1, which can be a polycrystalline silicon thin film transistor or low temperature polycrystalline silicon thin film transistor. The thin film transistor TFT2 positioned relatively upper and farther from the substrate 101 is referred to as a second thin film transistor TFT2, which can be an oxide thin film transistor.

The first thin film transistor TFT1 can be a driving transistor (DT of FIG. 2), but not limited thereto. The second thin film transistor TFT2 can be the first transistor T1, but not limited thereto.

The substrate 101 can be configured as, for example, a thin glass substrate (or glass film) or a plastic substrate (or plastic film) so as to implement a flexible characteristics of the display panel 100, but embodiments of the present disclosure are not limited thereto.

In a case where the substrate 101 is configured as a plastic substrate, for example, the substrate 101 can include at least one polyimide layer, but embodiments of the present disclosure are not limited thereto. For example, the substrate 101 can include a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

The first thin film transistor TFT1 can include a first semiconductor layer 105 disposed on the substrate 101, a first gate electrode 115 overlapping the first semiconductor layer 105 with a first insulating layer 110 interposed therebetween, and a first source electrode 151 and a first drain electrode 152 located on a fifth insulating layer 145 over the first gate electrode 115. Here, the first semiconductor layer 105 can be formed of polycrystalline silicon or low temperature polycrystalline silicon, but not limited thereto. In addition, a buffer layer may be disposed between the substrate 101 and the first semiconductor layer 105 to prevent moisture from permeating from the outside, and may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The first semiconductor layer 105 can include a central channel region and source and drain regions on both sides of the channel region. The first source electrode 151 and the first drain electrode 152 can be connected to the source region and the drain region of the first semiconductor layer 105 through the first and second contact holes 156 and 157 that are formed in the insulating layers 110, 120, 125, 135, and 145 located below the first source electrode 151 and the first drain electrode 152.

A second insulating layer 120 can be formed on the first gate electrode 115 of the first thin film transistor TFT1.

A third insulating layer 125 can be formed on the second insulating layer 120. The second thin film transistor TFT2 can be formed on the third insulating layer 125.

The second thin film transistor TFT2 can include a second semiconductor layer 130 on the third insulating layer 125, a second gate electrode 140 overlapping the second semiconductor layer 130 with a fourth insulating layer 135 interposed therebetween, and a second source electrode 153 and a second drain electrode 154 located on a fifth insulating layer 145 over the second gate electrode 140. Here, the second semiconductor layer 130 can be formed of an oxide semiconductor, but not limited thereto.

The second semiconductor layer 130 can include a central channel region and source and drain regions on both sides of the channel region. The second source electrode 153 and the second drain electrode 154 can be connected to the source and drain regions of the second semiconductor layer 130 through third and fourth contact holes 158 and 159 formed in the insulating layers 135 and 145 located below the second source electrode 153 and the second drain electrode 154. As shown in FIG. 5, the second source electrode 153 and the second drain electrode 154 may be formed on a same layer through a same process as that of the first source electrode 151 and the first drain electrode 152, so as to save the manufacturing cost of the display apparatus.

A sixth insulating layer (or first planarization layer) 160 can be formed on the second thin film transistor TFT2.

Here, the first, second, fourth, and fifth insulating layers 110, 120, 135, and 145 can be formed of an inorganic insulating material such as silicon nitride or silicon oxide, but not limited thereto.

In addition, the third and sixth insulating layers 125 and 160 can be formed of an organic insulating material such as photo acrylic or benzocyclobutene, but not limited thereto.

A connection electrode 162 can be formed on the sixth insulating layer 160. The connection electrode 162 can be connected to the first drain electrode 152 through a contact hole 161 formed in the sixth insulating layer 160.

A seventh insulating layer (or second planarization layer) 163 can be formed on the connection electrode 162. The seventh insulating layer 163 can be formed of an organic insulating material such as photo acrylic or benzocyclobutene, but not limited thereto.

The light emitting diode OD and a bank 165 can be formed on the seventh insulating layer 163. The bank 165 can be formed of a material including a black pigment or the like, or an organic material such as a benzocyclobutene resin, a polyimide resin, an acrylic resin, or a photosensitive polymer, but embodiments of the present disclosure are not limited thereto. When the bank 165 is formed of a material including a black pigment or a black dye, it can be a black bank. When the bank 165 is formed of a material including a black pigment or a black dye, light from an outside or light reflected toward the outside can be blocked, so that a luminance of the display apparatus can be further improved. A spacer can be further disposed on the bank 165. The spacer can be formed of the same material as the bank 165, but embodiments of the present disclosure are not limited thereto.

The light emitting diode OD can include an anode electrode (or first electrode) 171, a light emitting layer 172, and a cathode electrode (or second electrode) 173. For example, the light emitting layer 172 may include one or more of a hole injection layer (HIL), a hole transmitting layer (HTL), an electron transmitting layer (ETL) and an electron injection layer (EIL), but the present disclosure is not limited thereto.

The anode electrode 171 can be connected to the connection electrode 162 through the contact hole 164 formed in the seventh insulating layer 163.

The bank 165 can be disposed along a boundary of the pixel P and can be formed to cover an edge of the anode electrode 171. The light emitting layer 172 can be formed on the anode electrode 171 exposed through an opening of the bank 165.

The cathode electrode 173 can be formed on the light emitting layer 172 and can be applied with the low-potential driving voltage (EVSS of FIG. 2).

An encapsulation layer (or encapsulation portion) 180 can be formed on the cathode electrode 173. The encapsulation layer 180 can include at least one inorganic encapsulation layer and at least one organic encapsulation layer, but not limited thereto. In this disclosure, a structure of the encapsulation layer 180, in which a first encapsulation layer 181, a second encapsulation layer 182, and a third encapsulation layer 183 are sequentially stacked, is described as an example, but embodiments of the present disclosure are not limited thereto.

The first encapsulation layer 181 can be formed on the substrate 101 on which the cathode electrode 173 is formed. The third encapsulation layer 183 can be formed on the substrate 101 on which the second encapsulation layer 182 is formed, and can be formed to surround an upper surface, a lower surface, and a side surface of the second encapsulation layer 182 together with the first encapsulation layer 181. The first encapsulation layer 181 and the third encapsulation layer 183 can minimize, reduce or prevent external moisture or oxygen from penetrating into the light emitting diode OD. The first encapsulation layer 181 and the third encapsulation layer 183 can be formed of an inorganic insulating material capable of low-temperature deposition, such as silicon nitride, silicon oxide, silicon oxynitride, or aluminum oxide, but embodiments of the present disclosure are not limited thereto.

The second encapsulating layer 182 can acts as a buffer to relieve stress between layers due to bending of the display apparatus 10, and can flatten steps between layers. The second encapsulation layer 182 can be formed on the substrate 101 on which the first encapsulation layer 181 is formed, using a non-photosensitive organic insulating material such as acrylic resin, epoxy resin, phenolic resin, polyamide resin, polyimide resin, polyethylene, or silicon oxycarbide (SiOC), or a photosensitive organic insulating material such as photo acrylic, but not limited thereto. When the second encapsulation layer 182 is formed through an inkjet method, a dam DAM can be placed in the non-display region NA to prevent or reduce the second encapsulation layer 182 in liquid form from spreading to an edge of the substrate 101. The dam DAM can be disposed closer to the edge of the substrate 101 than the second encapsulation layer 182. By the dam DAM, the second encapsulation layer 182 can be prevented or reduced from spreading to a pad region, where a conductive pad is disposed, on an outermost edge of the substrate 101.

The dam DAM can be designed to prevent or reduce the spreading of the second encapsulation layer 182, but if the second encapsulation layer 182 is formed to exceed a height of the dam DAM during a process, the second encapsulation layer 182 as an organic layer may be exposed to an outside, so that moisture, etc. can easily penetrate into the light emitting element. To prevent or reduce this, at least one dam DAM can be formed in succession, but not limited thereto. Although two dams DAM are shown in FIG. 5, the present disclosure is not limited thereto, and three or more dams DAM may be disposed to have better moisture blocking effect.

The dam DAM can be formed simultaneously with the third insulating layer 125, the sixth insulating layer 160, and the seventh insulating layer 163, but embodiments of the present disclosure are not limited thereto. When forming the third insulating layer 125, a lower layer of the dam DAM can be formed together, and when forming the sixth and seventh insulating layers 160 and 163, an upper layer of the dam DAM can be formed together, so that the dam DAM can be formed in a triple laminated structure, but embodiments of the present disclosure are not limited thereto. As another example, the dam DAM can be formed with one or two of the third, sixth, and seventh insulating layers 125, 160, and 163, but embodiments of the present disclosure are not limited thereto.

Accordingly, the dam DAM can be formed of the same material as the third insulating layer 125, the sixth insulating layer 160, and the seventh insulating layer 163, but not limited thereto.

The dam DAM can be formed to overlap a low-potential driving voltage line VSSL. For example, the low-potential driving voltage line VSSL can be formed at a lower layer of a region, where the dam DAM is located, in the non-display region NA.

The low-potential driving voltage line VSSL and the gate driving portion 210 configured in the GIP structure can be formed along a periphery of the display panel 100, and the low-potential driving voltage line VSSL can be located outside the gate driving portion 210. In addition, the low-potential driving voltage line VSSL can be connected to the cathode electrode 173 to apply the low-potential driving voltage EVSS. The gate driving portion 210 is simply shown in a planar and cross-sectional manner in the drawings, but can be configured with the same structure as the first thin film transistor TFT1 and/or the second thin film transistor TFT2 of the display region AA.

A touch layer (or touch element layer or touch portion) 190 can be disposed on the encapsulation layer 180. In the touch layer 190, a buffer layer 191 can be positioned between a touch sensor metal including touch electrode connection lines 192 and 194 and touch electrodes 195 and 196, and the cathode electrode 173 of the light emitting diode OD.

The buffer layer 191 can block a chemical solution (developer, etchant, etc.) used in a manufacturing process of the touch sensor metal disposed on the buffer layer 191 or moisture from the outside from penetrating into the light emitting layer 172 containing an organic material. Accordingly, the buffer layer 191 can prevent or reduce damage to the light emitting layer 172 that is vulnerable to the chemical solution or moisture.

According to a mutual-capacitance-based touch sensor structure, the touch electrodes 195 and 196 can be disposed on the buffer layer 191, and the touch electrodes 195 and 196 can be arranged to cross each other, but embodiments of the present disclosure are not limited thereto.

The touch electrode connection lines 192 and 194 can electrically connect the touch electrodes 195 and 196. One of the touch electrode connection lines 192 and 194, and the touch electrodes 195 and 196 can be located at different layers with an insulation layer 193 interposed therebetween, but embodiments of the present disclosure are not limited thereto. In addition, one of the touch electrode connection lines 192 and 194 and the other of the touch electrode connection lines 192 and 194 can be located at different layers with the touch insulation layer 193 interposed therebetween, but embodiments of the present disclosure are not limited thereto.

The touch electrode connection lines 192 and 194 can be arranged to overlap the bank 165, thereby preventing or reducing decrease in aperture ratio, but not limited thereto.

A part of the touch electrode connection line 192 can extend along the top and side surfaces of the encapsulation layer 180 and the top and side surfaces of the dam DAM and be connected to a touch pad 198 to be electrically connected to a touch driving circuit.

A part of the touch electrode connection line 192 can receive a touch driving signal from the touch driving circuit and transmit it to the touch electrodes 195 and 196, and can transmit a touch sensing signal detected by the touch electrodes 195 and 196 to the touch driving circuit.

A protective layer 197 can be disposed on the touch electrodes 195 and 196. In the drawing, the protective layer 197 is shown as being disposed only on the touch electrodes 195 and 196, but not limited thereto, and the protective layer 197 can extend before or after the dam DAM to be disposed on the touch electrode connection line 192.

In addition, a color filter can be disposed on the encapsulation layer 180. The color filter can be positioned on the touch layer 190, or between the encapsulation layer 180 and the touch layer 190, but embodiments of the present disclosure are not limited thereto.

Hereinafter, structure and method for improving occurrence of the mura MR according to the embodiment of the present disclosure are described in detail.

Referring to FIG. 1, the data driving portion 220 can receive the image data Do and the data control signal DCS from the timing control portion 240, and in response to the data control signal DCS, the data driving portion 220 can convert the image data Do into analog image data for example, data voltages Vdata, and outputs them to the respective data lines DL in horizontal line units.

The data driving portion 220 can include at least one data IC. In this case, the data IC of the data driving portion 220 can be connected to the non-display region NA on the corresponding one side of the display panel 100 while mounted on a flexible circuit film, or can be mounted directly on the non-display region NA, but embodiments of the present disclosure are not limited thereto.

The timing control portion 240 can receive the image data Do and various timing signals, such as a vertical synchronization signal VSY, a horizontal synchronization signal HSY, a data enable signal DE, and a dot clock signal CLK, from an external host system through an interface such as an LVDS (Low Voltage Differential Signaling) interface or a TMDS (Transition Minimized Differential Signaling) interface. The timing control portion 240 can use the timing signals VSY, HSY, DE and CLK to generate the data control signal DCS and the gate control signal GCS and output them to the data driving portion 220 and the gate driving portion 210, respectively.

The gate control signal GCS can include, for example, a start signal that starts output of the gate signals of the gate driving portion 210 by frame. The gate control signal GCS can include a first scan start signal VST1 for starting output of the first scan signal SC1, a second scan start signal VST2 for starting output of the second scan signals SC2_O and SC2_E, a third scan start signal VST3 for starting output of the third scan signal SC3, a fourth scan start signal VST4 for starting output of the fourth scan signal SC4, and an emission start signal VSTE for starting output of the emission control signal EM, but embodiments of the present disclosure are not limited thereto.

In this case, the first scan start signal VST1 can be applied to the first first scan stage SSC1 (for example, the first one of the first scan stages SSC1) located at the top (or the frontmost), so that the first scan signal SC1 can be output to the first horizontal line (for example, the first odd and even horizontal lines) corresponding to the top horizontal line. In addition, the second scan start signal VST2 can be applied to the first odd second scan stage SSC2_O (for example, the first one of the odd second scan stages SSC2_O), so that the second scan signal SC2 can be output to the first odd horizontal line corresponding thereto. In addition, the third scan start signal VST3 can be applied to the first third scan stage SSC3 (for example, the first one of the third scan stages SSC3), so that the third scan signal SC3 can be output to the first horizontal line corresponding thereto. The fourth scan start signal VST4 can be applied to the first fourth scan stage SSC4 (for example, the first one of the fourth scan stages SSC4), so that the fourth scan signal SC4 can be output to the first horizontal line corresponding thereto.

In the present disclosure, a dummy gate driving portion 250 can be placed in the non-display region NA. The dummy gate driving portion 250 can be configured, for example, in a GIP structure and be formed directly in the non-display region NA of the display panel 100, similar to the gate driving portion 210, but embodiments of the present disclosure are not limited thereto.

The dummy gate driving portion 250 can be placed on an upper side of the gate driving portion 210 so as to output a dummy gate signal before the gate signal output of the gate driving portion 210.

The dummy gate driving portion 250 can include a dummy first scan driving circuit and a dummy fourth scan driving circuit. For example, the first scan driving circuit can output or sequentially output a dummy first scan signal which can be a signal having the same form as the first scan signal SC1 of the gate driving portion 210. The dummy fourth scan driving circuit can output or sequentially output a dummy fourth scan signal which can be a signal having the same form as the fourth scan signal SC4 of the gate driving portion 210.

Each of the dummy first scan driving circuit and the dummy fourth scan driving circuit can be configured with a shift register including a dummy stage that outputs the corresponding dummy scan signal, but embodiments of the present disclosure are not limited thereto.

Figure 6:
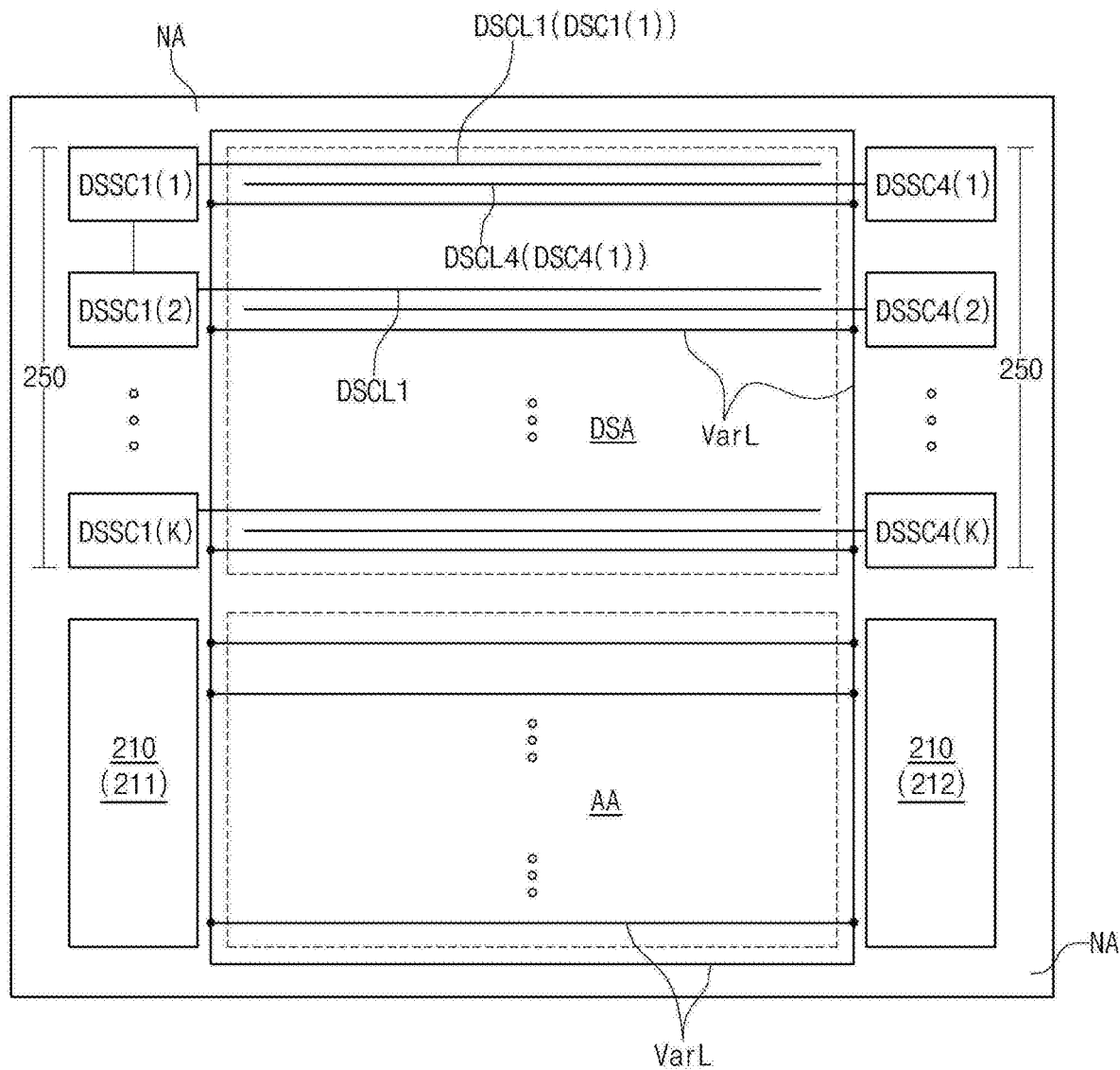
FIG. 6 is a view illustrating a configuration of a dummy gate driving portion according to an example embodiment of the present disclosure.

A configuration of the dummy gate driving portion 250 is described with further reference to FIG. 6. FIG. 6 is a view illustrating a configuration of a dummy gate driving portion according to an embodiment of the present disclosure.

The dummy gate driving portion 250 can include the dummy first scan driving circuit and the dummy fourth scan driving circuit. For example, the dummy first scan driving circuit can be provided in the non-display region NA where the first scan driving circuit is arranged, for example, in the left non-display region NA. The dummy fourth scan driving circuit can be provided in the non-display region NA where the fourth scan driving circuit is arranged, for example, in the right non-display region NA. The arrangement of the dummy first and fourth scan driving circuits is an example, and can be arranged in various other forms.

The dummy first scan driving circuit can be configured of a plurality of, for example, K dummy first scan stages DSSC1 arranged in the direction from top to bottom as the scan direction, which are the first to K-th dummy first scan stages DSSC1(1) to DSSC1(K).

The dummy fourth scan driving circuit can be configured of a plurality of, for example, K dummy fourth scan stages DSSC4 arranged in the direction from top to bottom as the scan direction, which are the first to K-th dummy fourth scan stages DSSC4(1) to DSSC4(K).

The non-display region NA on the upper side of the display region AA can include a dummy scan region (or dummy region) DSA where a dummy gate line DGL supplied with the dummy gate signal output from the dummy gate driving portion 250 is arranged.

For example, in the dummy scan region DSA, a dummy first scan line DSCL1 to which the dummy first scan signal DSC1 output or sequentially output from the dummy first scan driving circuit is applied can extend horizontally, and a dummy fourth scan line DSCL4 to which the dummy fourth scan signal DSC4 output or sequentially output from the dummy second scan driving circuit is applied can extend horizontally.

The dummy first scan line DSCL1 and the dummy fourth scan line DSCL4 can be arranged in each of K horizontal lines (or dummy horizontal lines), for example, each of first to K-th horizontal lines within the dummy scan region DSA, similarly to the first scan line SCL1 and the fourth scan line DSL4 within the display region AA.

The dummy scan region DSA can be substantially a part of the non-display region NA to which the dummy scan signals DSC1 and DSC4 are applied, and the pixels P within the display region AA may not be formed in the dummy scan region DSA. For example, a circuit element within the pixel P for emitting light may not be formed in the dummy scan region DSA.

The dummy first scan stage DSSC1 constituting the dummy first scan driving circuit can be configured substantially identically to the first scan stage SSC1 of the gate driving portion 210, and can output a signal of the same waveform as the first scan stage SSC1.

For example, a plurality of dummy first scan stages DSSC1 can sequentially generate the dummy first scan signals DSC1 and output the dummy first scan signal DSC1s to a plurality of dummy first scan lines DSCL1, respectively.

The dummy fourth scan stage DSSC4 constituting the dummy fourth scan driving circuit can be configured substantially identically to the fourth scan stage SSC4 of the gate driving portion 210, and can output a signal of the same waveform as the fourth scan stage SSC4.

For example, a plurality of dummy fourth scan stages DSSC4 can sequentially generate the dummy fourth scan signal DSC4 and output the dummy fourth scan signals DSC4 to a plurality of dummy fourth scan lines DSCL4, respectively.

Referring to FIG. 6, the voltage line VarL that transmits the anode reset voltage Var into the display region AA can be formed in the display region AA and the non-display region NA.

The voltage line VarL can be formed across the display region AA and the dummy scan region DSA. For example, an outer portion of the voltage line VarL can be formed along a periphery of the display region AA and the dummy scan region DSA. In addition, a portion of the voltage line VarL that horizontally crosses the display region AA and the dummy scan region DSA can be formed. For example, the voltage line VarL can be arranged per horizontal line of the display region AA and the dummy scan region DSA, but embodiments of the present disclosure are not limited thereto. In addition, the voltage line VarL can be formed in a form that vertically crosses the display region AA and the dummy scan region DSA, but embodiments of the present disclosure are not limited thereto.

The voltage line VarL arranged in this manner can be adjacent to or overlap the scan lines (e.g., the first and fourth scan lines SCL1 and SCL4) that transmit the scan signals to the display region AA, so that electrical coupling can occur. In addition, the voltage line VarL can be adjacent to or overlap the dummy first scan line DSCL1 and the dummy fourth scan line DSCL4 that transmit the dummy scan signals to the dummy scan region DSA, so that electrical coupling can occur.

The dummy gate driving portion 250 can include a switch circuit. The switch circuit can select (or set) the start of sequential output (or output) of the dummy first scan signal DSC1 in the dummy first scan driving circuit. The switch circuit can select (or set) the start of sequential output (or output) of the dummy fourth scan signal DSC4 in the dummy fourth scan driving circuit.

Figure 7:
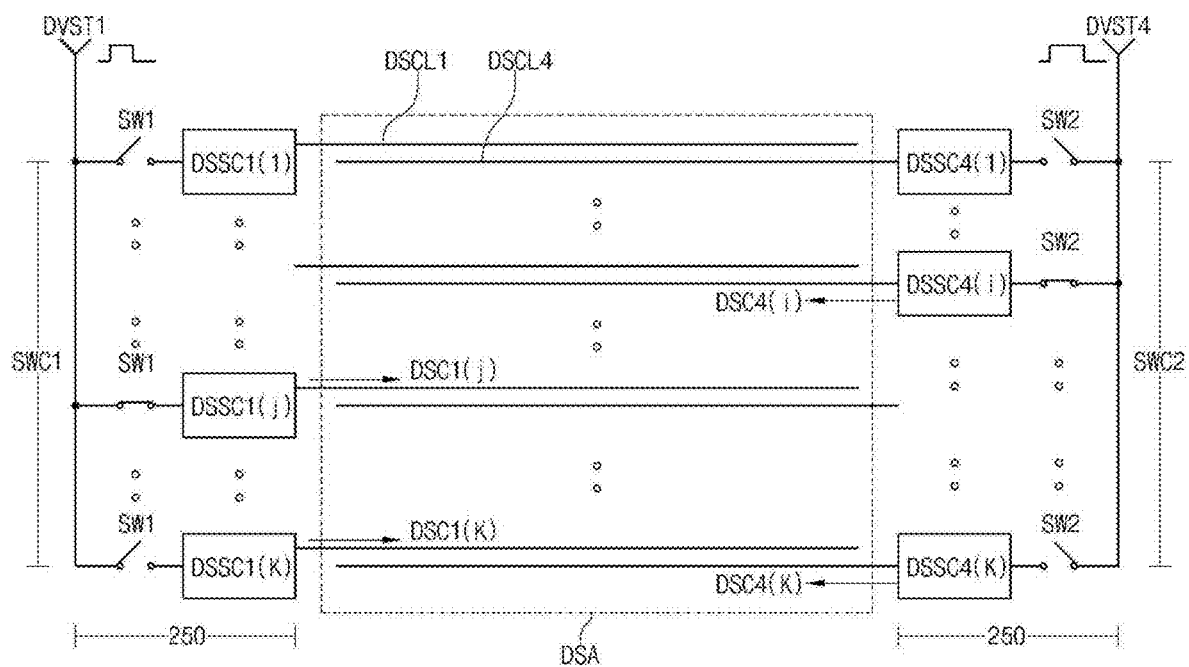
FIG. 7 is a view illustrating a switch circuit of a dummy gate driving portion according to an example embodiment of the present disclosure.

The switch circuit of the dummy gate driving portion 250 is described with further reference to FIG. 7. FIG. 7 is a view illustrating a switch circuit of a dummy gate driving portion according to an embodiment of the present disclosure.

For example, the dummy gate driving portion 250 can be configured with a first switch circuit SWC1 which is for selecting a dummy first scan stage DSSC1 that starts output or sequential output among the dummy first scan stages DSSC1(1) to DSSC1(K) included in the dummy first scan driving circuit.

Similarly, the dummy gate driving portion 250 can be configured with a second switch circuit SWC2 which is for selecting a dummy fourth scan stage DSSC4 that starts output or sequential output among the dummy fourth scan stages DSSC4(1) to DSSC4(K) included in the fourth scan driving circuit.

The first switch circuit SWC1 can include first switches SW1 respectively connected to the first to K-th dummy first scan stages DSSC1(1) to DSSC1(K) of the dummy first scan driving circuit.

The second switch circuit SWC2 can include second switches SW2 respectively connected to the first to K-th dummy fourth scan stages DSSC4(1) to DSSC4(K) of the dummy fourth scan driving circuit.

According to the present disclosure, as the first switch circuit SWC1 is configured, the dummy first scan stage DSSC1 to which a dummy first scan start signal DVST1 for starting the scan operation of the dummy first scan driving circuit is input can be selected. In addition, according to the present disclosure, as the second switch circuit SWC2 is configured, the dummy fourth scan stage DSSC4 to which a dummy fourth scan start signal DVST4 for starting the scan operation of the dummy fourth scan driving circuit is input can be selected. Here, the dummy first scan start signal DVST1 and the dummy fourth scan start signal DVST4 can be generated and output from the timing control portion 240.

For example, as illustrated in FIG. 7, when the dummy first scan driving circuit is driven so that the scan operation of the dummy first scan signal DSC1 starts at a j-th dummy first scan stage DSSC1(j), the first switch SW1 connected to the j-th dummy first scan stage DSSC1(j) can be turned on, and other first switches SW1 connected to the first to j−1-th and j+1-th to K-th dummy first scan stages DSSC1(1) to DSSC1(j−1) and DSSC1(j+1) to DSSC1(K) can be turned off.

Accordingly, the dummy first scan start signal DVST1 can be input to the j-th dummy first scan stage DSSC1(j), so that the output of the dummy first scan signal DSC1 can start from the j-th dummy first scan stage DSSC1(j). In addition, the j+1-th to K-th dummy first scan stages DSSC1(j+1) to DSSC1(K) located below the j-th dummy first scan stage DSSC1(j) can sequentially output the respective dummy first scan signals DSC1(j+1) to DSC1(K) by each receiving a carry signal, which is the output signal of its previous dummy first scan stage DSSC1, as a start signal.

Thus, in the dummy first scan driving circuit, starting with the j-th dummy first scan stage DSSC1(j), the j-th to K-th dummy first scan stages DSSC1(j) to DSSC1(K) can be activated to perform a signal output operation, and the first to j−1-th dummy first scan stages DSSC1(1) to DSSC1(j−1) preceding the j-th dummy first scan stage DSSC1(j) can be inactivated to not perform a signal output operation.

In addition, as illustrated in FIG. 7, when the dummy fourth scan driving circuit is driven so that the scan operation of the dummy fourth scan signal DSC4 starts in an i-th dummy fourth scan stage DSSC4(i), the second switch SW2 connected to the i-th dummy fourth scan stage DSSC4(i) can be turned on, and other second switches SW2 connected to the first to i−1-th and i+1-th to K-th dummy fourth scan stages DSSC4(1) to DSSC4(i−1) and DSSC4(i+1) to DSSC4(K) can be turned off.

Accordingly, the dummy fourth scan start signal DVST4 can be input to the i-th dummy fourth scan stage DSSC4(i), so that the output of the dummy fourth scan signal DSC4 can start from the i-th dummy fourth scan stage DSSC4(i). In addition, the i+1-th to K-th dummy fourth scan stages DSSC4(i+1) to DSSC4(K) located below the i-th dummy fourth scan stage DSSC4(i) can sequentially output the respective dummy fourth scan signals DSC4(i+1) to DSC4(K) by each receiving a carry signal, which is the output signal of its previous dummy fourth scan stage DSSC4, as a start signal.

Thus, in the dummy fourth scan driving circuit, starting with the i-th dummy fourth scan stage DSSC4(i), the i-th to K-th dummy fourth scan stages DSSC4(i) to DSSC4(K) can be activated to perform a signal output operation, and the first to i−1-th dummy fourth scan stages DSSC4(1) to DSSC4(i−1) preceding the i-th dummy fourth scan stage DSSC4(i) can be inactivated to not perform a signal output operation.

In the present disclosure, for each of the dummy first scan driving circuit and the dummy fourth scan driving circuit, through the stage selection operation of each of the first and second switch circuits SWC1 and SWC2, the timing at which the scan operation of each of the dummy first and fourth scan signals DSC1 and DSC4 starts can be selected.

When the start timings of the scan operations of the dummy first and fourth scan signals DSC1 and DSC4 are selected, each of the dummy first and fourth scan signals DSC1 and DSC4 generated accordingly can have a toggling direction opposite to each of the first and fourth scan signals SC1 and SC4, which are at a top region (or upper region) of the display region AA and can cause ripple in the anode reset voltage Var, at the same time, so that each of the dummy first and fourth scan signals DSC1 and DSC4 can offset (or cancel out) the ripple influence by each of the first and fourth scan signals SC1 and SC4 to the anode reset voltage Var. The ripple in the anode reset voltage Var caused by the toggling of the first and fourth scan signals SC1 and SC4 at the top region of the display region AA can be canceled, reduced or prevented. At a portion of the display region AA where the anode reset voltage Var is applied when the ripple occurs, poor image quality in which a luminance changes due to the ripple and a band-shaped mura is recognized can be prevented or reduced.

As mentioned above, in each horizontal line of the display region AA, the first and fourth scan signals SC1 and SC4 can be applied in the first period SB1 of the frame period Ft, and the third scan signal SC3 can be applied in the first period SB1 and the second period SB2 of the frame period Ft.

A period of the third scan signal SC3 can be approximately ½ times (for example, half) that of each of the first and fourth scan signals SC1 and SC4. For example, a frequency of the third scan signal SC3 can be approximately twice that of each of the first and fourth scan signals SC1 and SC4.

Figure 8:
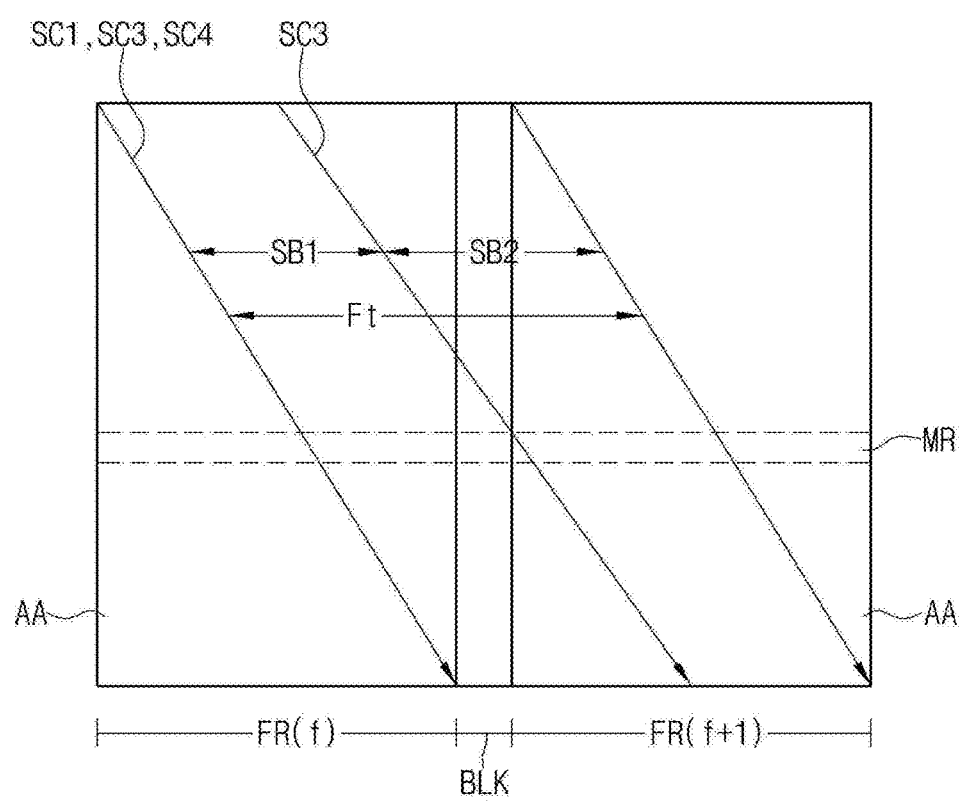
FIG. 8 is a view schematically illustrating scan operations of first, third, and fourth scan signals in a display region according to an example embodiment of the present disclosure.

This can refer to FIG. 8. FIG. 8 is a view schematically illustrating scan operations of first, third, and fourth scan signals in a display region according to an embodiment of the present disclosure.

Referring to FIG. 8, the first, third, and fourth scan signals SC1, SC3, and SC4 can be sequentially output from the first horizontal line at the top of the display region AA to the N-th horizontal line at the bottom of the display region AA for each frame (FR: FR(f) and FR(f+1)). In this regard, the first, third, and fourth scan signals SC1, SC3, and SC4 in each horizontal line can be generated at the beginning of the first period SB1 of the frame period Ft of the horizontal line.

In each horizontal line, the third scan signal SC3, for example, the third scan pulse (P3_3 in FIG. 4) of the third scan signal SC3 can be generated at the beginning of the second period SB2 of the frame period Ft. As such, the third scan signal SC3 of the display region AA generated in the second period SB2 can be applied to the first horizontal line in a current frame FR, for example, a f-th frame FR(f) (e.g., approximately in a middle of the f-th frame FR(f)) and be sequentially output so that it can be applied to the N-th horizontal line in a next frame FR for example, a f+1-th frame FR(f+1) (e.g., approximately in a middle of the f+1-th frame FR(f)).

Due to the characteristics of the sequential scanning, an end edge, for example, a falling edge of the scan pulse of the first scan signal SC1 can be located at the same time as a start edge, for example, a rising edge of the scan pulse of the first scan signal SC1 positioned lower and output later. For example, the falling edge of the first scan signal SC1(*n*) of the n-th horizontal line can be located at the same time as the rising edge of the first scan signal SC1(*n*+m) of the n+m-th horizontal line. Similarly, an end edge, for example, a falling edge of the scan pulse of the fourth scan signal SC4 can be located at the same time as a start edge, for example, a rising edge of the fourth scan signal SC4 position lower and output later.

Therefore, when the toggling directions of the edges of the scan pulse are opposite to each other at the same time and cancel each other out, the ripples of the anode reset voltage Var caused by the scan pulses at this time can be canceled out, reduced or prevented.

As mentioned above, the voltage line VarL transmitting the anode reset voltage Var can be formed in the display region AA and the non-display region NA of the display panel 100. The voltage line VarL can be adjacent to or overlap the scan line transmitting the scan signal to produce electrical coupling, and due to the electrical coupling, the ripple of the anode reset voltage Var can be induced in the toggling direction at the edge of the scan pulse where the toggling occurs.

The ripple of the anode reset voltage Var can be caused mainly by the scan pulse of the first scan signal SC1(more specifically, the first scan pulse P1_1 of the first scan signal SC1) and the scan pulse P4 of the fourth scan signal SC4. It is to be noted that the ripple of the anode rest voltage Var may be caused by other scan signals such as SC2, SC3 or emission control signal EM by disposing the voltage line VarL being adjacent to or overlapping corresponding lines, and in this case, the dummy gate driving portion 250 may include dummy driving circuits corresponding to the scan signal SC2 and SC3 or emission control signal EM, so as to reduce or prevent the ripples of the anode reset voltage Var.

As mentioned above, the falling edge of each of the first and fourth scan signals SC1 and SC4 can be offset by the rising edge of each of the later-output first and fourth scan signals SC1 and SC4, so that the ripple in the anode reset voltage Var may not be caused by the later-output first and fourth scan signals SC1 and SC4.

However, due to the characteristics of the sequential scanning, each of the first and fourth scan signals SC1 and SC4 having the falling edge that offsets, at the same time, the rising edge of each of the first and fourth scan signals SC1 and SC4 which are output to the upper some horizontal lines of the display region AA where the scanning starts for each frame FR may not exist.

As a result, due to the rising edges of the first and fourth scan signals SC1 and SC4 in the initial scan section of each frame FR, the ripples can occur in the anode reset voltage Var electrically coupled with the scan signals SC1 and SC4 along the rising direction which is the toggling direction of the scan signals SC1 and SC4.

The anode reset voltage Var in which the ripple occur in the initial scan section of the frame FR can be applied into the pixels P of the horizontal line (e.g., the horizontal line at the approximate center of the display region AA) to which the third scan signal SC3 is applied in the initial scan section, as illustrated in FIG. 8.

In this case, a region to which the ripple of the anode reset voltage Var is applied may change in luminance due to the ripple (e.g., increase in luminance), and a band-shaped mura MR may occur along the region to which the ripple is applied.

In the present disclosure, the dummy gate driving portion 250 can be configured, and the dummy gate driving portion 250 can select the timings at which the scan operations of the dummy first and fourth scan signals DSC1 and DSC4 start through the stage selection operations of the first and second switch circuits SWC1 and SWC2.

Accordingly, each of the dummy first and fourth scan signals SC1 and SC4 having the falling edge opposite in toggling direction to the rising edge of each of the first and fourth scan signals SC1 and SC4 in the top region of the display region AA that can cause the ripple of the anode reset voltage Var can be selected and generated.

As a result, the ripples of the anode reset voltage Var caused by the toggling of the first and fourth scan signals SC1 and SC4 in the top region of the display region AA can be canceled, reduced or prevented, so that the occurrence of the mura MR due to the ripples in the portion of the display region AA where the third scan signal SC3 is applied in the initial scan section can be improved.

A method of generating the dummy first and fourth scan signals DSC1 and DSC4 to offset the rising edges of the corresponding first and fourth scan signals SC1 and SC4 in the initial scan section of the frame FR is described in more detail below.

Figure 9:
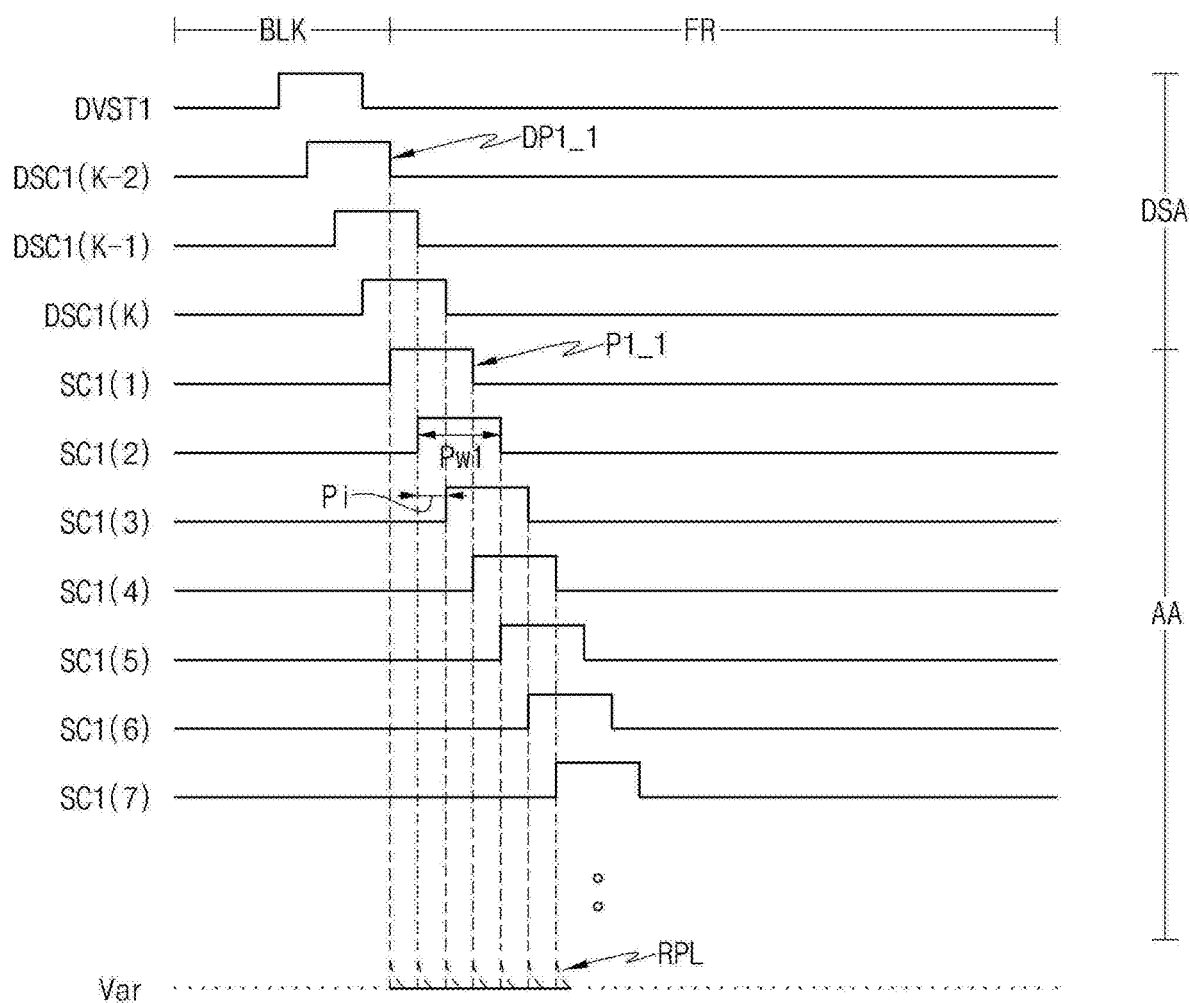
FIG. 9 is a view illustrating timings of a first scan signal and a dummy first scan signal according to an example embodiment of the present disclosure.
Figure 10:
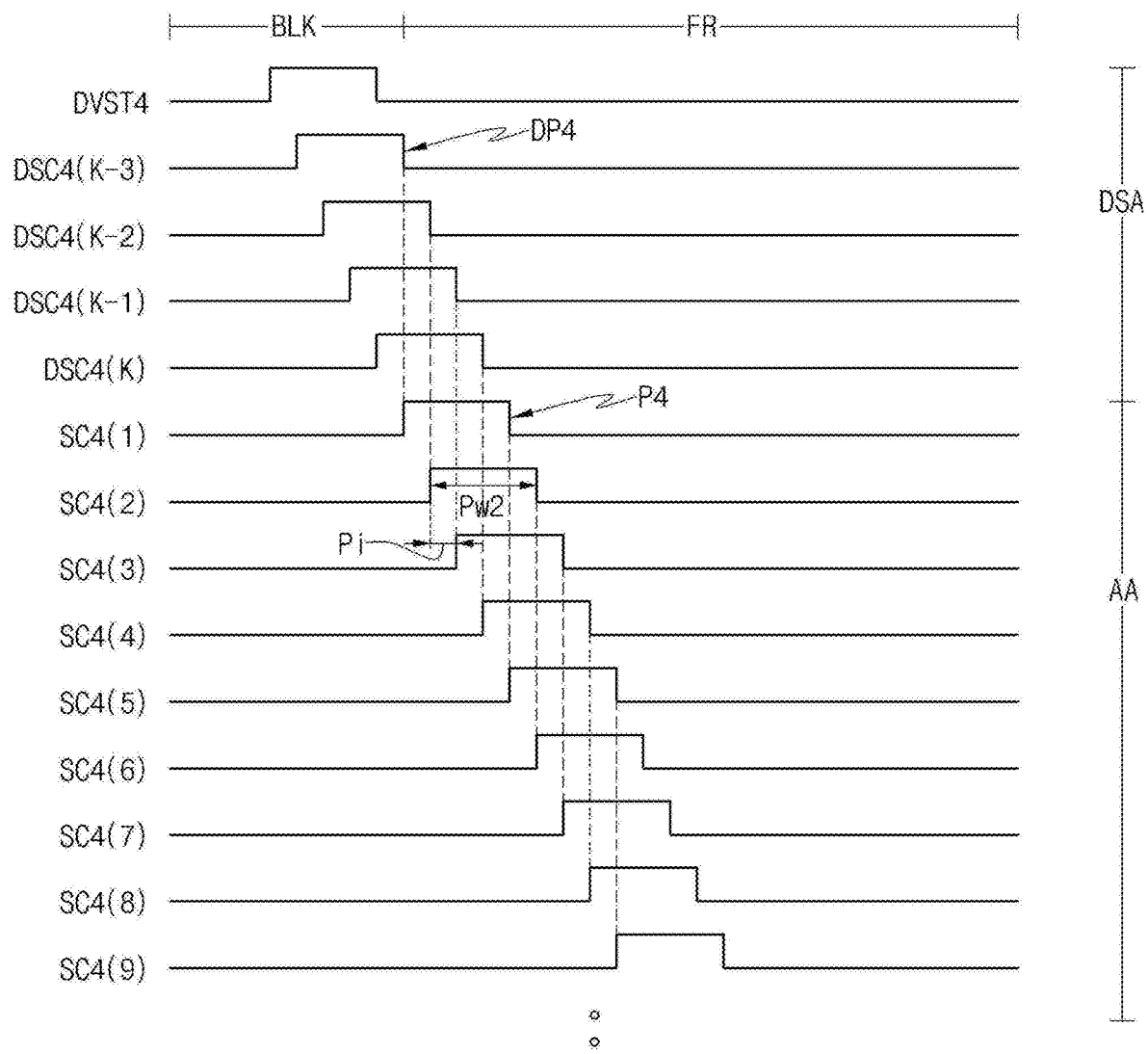
FIG. 10 is a view illustrating timings of a fourth scan signal and a dummy fourth scan signal according to an example embodiment of the present disclosure.

FIG. 9 is a view illustrating timings of a first scan signal and a dummy first scan signal according to an embodiment of the present disclosure. FIG. 10 is a view illustrating timings of a fourth scan signal and a dummy fourth scan signal according to an embodiment of the present disclosure.

In the present disclosure, for convenience of explanation, the first scan signal SC1 and the dummy first scan signal DSC1, and the fourth scan signal SC4 and the dummy fourth scan signal DSC4 are illustrated separately in FIGS. 9 and 10.

In FIG. 9, for convenience of explanation, the first scan pulse P1_1, which is the scan pulse of the first scan signal SC1 that causes the ripple RPL of the anode reset voltage Var, is illustrated, and the second scan pulse P1_2, which does not substantially cause the ripple RPL of the anode reset voltage Var, is omitted. In this regard, the second scan pulse P1_2 of the first scan signal SC1 is generated after the first scan pulse P1_1, and in the initial scan section of the frame FR, the rising edge and the falling edge of the second scan pulse P1_2 are positioned at the same time as the falling edge of the first scan pulse P1_1 output later and the rising edge of the second scan pulse P1_2 output later, so that they can be offset, and therefore the second scan pulse P1_2 does not substantially affect the ripple RPL of the anode reset voltage Var.

First, the first scan signal SC1 and the dummy first scan signal DSC1 are described with reference to FIG. 9 (and FIGS. 1 to 8). For each frame FR, the first scan signals SC1 can be sequentially generated and output to the corresponding horizontal lines of the display region AA.

The scan pulse P1_1 of the first scan signal SC1 can have a first pulse width Pw1. In addition, the scan pulse P1_1 of the first scan signal SC1 can be output or sequentially output with a pulse period Pi, and for example, an output time difference between the scan pulses P1_1 of adjacent horizontal lines can be expressed as the pulse period Pi.

Regarding the scan pulse P1_1 of the first scan signal SC1, the falling edge and the rising edge can be positioned at the same time at an interval of m horizontal lines (or in a unit of m horizontal lines). For example, within each scan pulse P1_1 of the first scan signal SC1 (for example, within the scan pulse P1_1 excluding the falling edge of the scan pulse P1_1), m−1 subsequent scan pulses P1_1 can be located.

As such, an interval in horizontal line between two scan pulses P1_1, where a falling edge of an earlier scan pulse P1_1 and a rising edge of a later scan pulse P1_1 are located at the same time, can be proportional to the first pulse width Pw1 of the scan pulse P1_1. In this regard, m, which is the interval in horizontal line between the scan pulses P1_1 with the falling edge of the earlier scan pulse P1_1 and the rising edge of the later scan pulse P1_1 located at the same time, can be expressed as m=Pw1/Pi. Accordingly, as the first pulse width Pw1 of the scan pulse P1_1 becomes longer, a number of the interval in horizontal line, m also becomes greater correspondingly.

In the present disclosure, for the convenience of explanation, a case in which the falling edge and the rising edge for the scan pulses P1_1 are positioned at the same time at the interval of three horizontal lines is taken as an example, but embodiments of the present disclosure are not limited thereto. For example, a case of Pw1/Pi=3 is taken as an example, but embodiments of the present disclosure are not limited thereto.

In this case, the falling edge of the scan pulse P1_1 of the first scan signal SC1(1) in the first horizontal line can coincide with the rising edge of the scan pulse P1_1 of the first scan signal SC1(4) in the fourth horizontal line which is spaced apart by three horizontal lines from the first horizontal line. Similarly, the falling edge of the scan pulse P1_1 of the first scan signal SC1(2) in the second horizontal line can coincide with the rising edge of the scan pulse P1_1 of the first scan signal SC1(5) in the fifth horizontal line. In addition, the falling edge of the scan pulse P1_1 of the first scan signal SC1(3) in the third horizontal line can coincide with the rising edge of the scan pulse P1_1 of the first scan signal SC1(6) in the sixth horizontal line.

Therefore, the first scan signals SC1 with a falling edge of an earlier scan pulse P1_1 and a rising edge of a later scan pulse P1_1 matching each other can have an interval of three signals.

In this case, for the rising edges of the first first scan signal SC1(1) to the third first scan signal SC1(3), which are the first scan signals SC1 in the initial scan section of the display region AA, there are no earlier first scan signals SC1 canceling them out.

If there are no falling edges that offset the rising edges of the first scan signals SC1(1) to SC1(3) in the initial scan section, the ripples RPL occurs in the anode reset voltage Var electrically coupled with the first scan signals SC1 due to the rising edges of the first scan signals SC1(1) to SC1(3).

In the present disclosure, in order to offset the rising edges of the first scan signals SC1(1) to SC1(3) in the initial scan section of the display region AA, the same number of dummy first scan signals DSC1 as them can be generated.

In this regard, among the K dummy first scan stages DSSC1(1) to DSSC1(K), the m dummy first scan stages DSSC1(K−m+1) to DSSC1(K) from the K-th dummy first scan stage DSSC1(K), which is the lowermost stage, can be activated and driven. For example, in a case of m=3, the K−2-th to K-th dummy first scan stages DSSC1(K−2) to DSSC1(K) can be activated to sequentially output the K−2-th to K-th dummy first scan signals DSC1(K−2) to DSC1(K).

In order to activate and drive the K−2-th to K-th dummy first scan stages DSSC1(K−2) to DSSC1(K), as mentioned above, the first switch circuit SWC1 can perform the switching operation to provide the dummy first scan start signal DVST1 to the K−2-th dummy first scan stage DSSC1(K−2).

In this regard, among the K first switches SW1 constituting the first switch circuit SWC1, the first switch SW1 connected to the K−2-th dummy first scan stage DSSC1(K−2) can be turned on, and the remaining first switches SW1 can be turned off. Accordingly, the dummy first scan start signal DVST1 can be provided to the selected K−2-th dummy first scan stage DSSC1(K−2), and in response thereto, the output of the dummy first scan signal DSC1 (for example, DSC1(K−2)) starts from the K−2-th dummy first scan stage DSSC1(K−2), and thereafter, the later dummy first scan stages DSSC1(K−1) and DSSC1(K) can be sequentially operated to output the corresponding dummy first scan signals DSC1(K−1) and DSC1(K).

The dummy first scan signals DSC1(K−2) to DSC1(K) generated in this manner can be output prior to the first first scan signal SC1(1), and can have a scan pulse DP1_1 substantially identical to the scan pulse P1_1 of the first scan signals SC1.

For example, the dummy first scan signals DSC1(K−2) to DSC1(K) can have the same pulse period Pi as the first scan signals SC1, and an interval of the pulse period Pi can be provided between the K-th dummy first scan signal DSC1(K) and the first first scan signal SC1(1). In addition, the dummy first scan signals DSC1(K−2) to DSC1(K) can have the same first pulse width Pw1 as the first scan signals SC1.

Therefore, the dummy first scan signals DSC1 and the first scan signals SC1 can be considered as scan signals of the same waveform that are output at regular intervals or sequentially output, when viewed as a whole.

As above, the falling edge of the scan pulse DP1_1 of each of the three dummy first scan signals DSC1(K−2) to DSC1(K) output in the final scan section of the dummy scan region DSA can coincide with the rising edge of the scan pulse P1_1 of each of the three first scan signals SC1(1) to SC1(3) in the initial scan section of the display region AA.

In this regard, the falling edge of the K−2-th dummy first scan signal DSC1(K−2) can be positioned at the same time as the rising edge of the first first scan signal SC1(1). In addition, the falling edge of the K−1-th dummy first scan signal DSC1(K−1) can be positioned at the same time as the rising edge of the second first scan signal SC1(2). In addition, the falling edge of the K-th dummy first scan signal DSC1(K) can be positioned at the same time as the rising edge of the third first scan signal SC1(3).

Therefore, the rising edges of the first scan signals SC1(1) to SC1(3) in the initial scan section of the display region AA can be offset by the dummy first scan signals DSC1(K−2) to DSC1(K) in the final scan section of the dummy scan region DSA which can be considered as scan signals preceding them.

Therefore, the ripples RPL in the rising direction that are induced in the anode reset voltage Var electrically coupled with the first scan signals SC1(1) to SC1(3) in the initial scan section due to the rising edges of the first scan signals SC1(1) to SC1(3) can be offset by the ripples in the falling direction that are induced in the anode reset voltage Var electrically coupled with the dummy first scan signals DSC1(K−2) to DSC1(K) in the final dummy scan section due to the falling edges of the dummy first scan signals DSC1(K−2) to DSC1(K).

Accordingly, the ripples RPL in the anode reset voltage Var due to the toggling of the first scan signals SC1 in the top region of the display region AA, which corresponds to the initial scan section, can be prevented or reduced, so that the occurrence of the mura MR at the portion of the display region AA, to which the third scan signals SC3 are applied in the initial scan section, due to the ripples RPL in the anode reset voltage Var can be improved.

As described above, the rising edge of the dummy first scan signal DSC1 that cancels out the first scan signal SC1 in the initial scan section can be located within a blank BLK between adjacent frames FR. In this regard, the blank BLK between the frames FR can be a section that has little influence on the driving of the display panel 100, so that when the rising edge of the dummy first scan signal DSC1 is located within the blank BLK, its influence on the driving characteristics of the display panel 100 can be significantly low.

Next, the fourth scan signal SC4 and the dummy fourth scan signal DSC4 are described with reference to FIG. 10 (and FIGS. 1 to 8). For each frame FR, the fourth scan signals SC4 can be sequentially generated and output to the corresponding horizontal lines of the display region AA.

The scan pulse P4 of the fourth scan signal SC4 can have a second pulse width Pw2. In addition, the scan pulse P4 of the fourth scan signal SC4 can be output or sequentially output with a pulse period Pi. Accordingly, the fourth scan signal SC4 can have the same pulse period Pi as the first scan signal SC1.

Regarding the scan pulse P4 of the fourth scan signal SC4, the falling edge and the rising edge can be positioned at the same time at an interval of h horizontal lines (or in a unit of h horizontal lines). For example, within each scan pulse P4 of the fourth scan signal SC4, h−1 subsequent scan pulses P4 can be located.

As such, the interval in horizontal line between two scan pulses P4, where a falling edge of an earlier scan pulse P4 and a rising edge of a later scan pulse are located at the same time, can be proportional to the second pulse width Pw2 of the scan pulse P4. In this regard, h, which is the interval in horizontal line between the scan pulses P4 with the falling edge of the earlier scan pulse P4 and the rising edge of the later scan pulse P4 located at the same time, can be expressed as h=Pw2/Pi. Accordingly, as the second pulse width Pw2 of the scan pulse P4 becomes longer, a number of the interval in horizontal line, h also becomes greater correspondingly.

In the present disclosure, a case where the second pulse width Pw2 of the fourth scan signal SC4 is wider than the first pulse width Pw1 of the first scan signal SC1 is taken as an example, but embodiments of the present disclosure are not limited thereto. As an example, a case where the falling edge and the rising edge of the scan pulses P4 are positioned at the same time at the interval of four horizontal lines is taken as an example, but embodiments of the present disclosure are not limited thereto. For example, a case of Pw2/Pi=4 is taken as an example, but embodiments of the present disclosure are not limited thereto.

In this case, the falling edge of the scan pulse P4 of the fourth scan signal SC4(1) in the first horizontal line can coincide with the rising edge of the scan pulse P4 of the fourth scan signal SC4(5) in the fifth horizontal line which is spaced apart by four horizontal lines. Similarly, the falling edge of the scan pulse P4 of the fourth scan signal SC4(2) in the second horizontal line can coincide with the rising edge of the scan pulse P4 of the fourth scan signal SC4(6) in the sixth horizontal line. In addition, the falling edge of the scan pulse P4 of the fourth scan signal SC4(3) in the third horizontal line can coincide with the rising edge of the scan pulse P4 of the fourth scan signal SC4(7) in the seventh horizontal line. In addition, the falling edge of the scan pulse P4 of the fourth scan signal SC4(4) in the fourth horizontal line can coincide with the rising edge of the scan pulse P4 of the fourth scan signal SC4(8) in the eighth horizontal line.

Therefore, the fourth scan signals SC4 with a falling edge of an earlier scan pulse P4 and a rising edge of the later scan pulse P4 matching each other can have an interval of four signals.

In this case, for the rising edges of the first fourth scan signal SC4(1) to the fourth fourth scan signal SC4(4), which are the fourth scan signals SC4 in the initial scan section of the display region AA, there are no earlier fourth scan signals SC4 canceling them out.

If there are no falling edges that offset the rising edges of the fourth scan signals SC4(1) to SC4(4) in the initial scan section, the ripples (RPL in FIG. 9) occurs in the anode reset voltage Var electrically coupled with the fourth scan signals SC4 due to the rising edges of the fourth scan signals SC4(1) to SC4(4).

In the present disclosure, in order to offset the rising edges of the fourth scan signals SC4(1) to SC4(4) in the initial scan section of the display region AA, the same number of dummy fourth scan signals DSC4 as them can be generated.

In this regard, among the K dummy fourth scan stages DSSC4(1) to DSSC4(K), the h dummy fourth scan stages DSSC4(K−h+1) to DSSC4(K) from the K-the dummy fourth scan stage DSSC4(K) can be activated and driven. For example, in a case of h=4, the K−3-th to K-th dummy fourth scan stages DSSC4(K−3) to DSSC4(K) can be activated to sequentially output the K−3-th to K-th dummy fourth scan signals DSC4(K−3) to DSC4(K).

In order to activate and drive the K−3-th to K-th dummy fourth scan stages DSSC4(K−3) to DSSC4(K), as mentioned above, the second switch circuit SWC2 can perform the switching operation to provide the dummy fourth scan start signal DVST4 to the K−3-th dummy fourth scan stage DSSC4(K−3).

In this regard, among the K second switches SW2 constituting the second switch circuit SWC2, the second switch SW2 connected to the K−3-th dummy fourth scan stage DSSC4(K−3) can be turned on, and the remaining second switches SW2 can be turned off. Accordingly, the dummy fourth scan start signal DVST4 can be provided to the selected K−3-th dummy fourth scan stage DSSC4(K−3), and in response thereto, the output of the dummy fourth scan signal DSC4 (for example, DSC4(K−3)) starts from the K−3-th dummy fourth scan stage DSSC4(K−3), and thereafter, the later dummy fourth scan stages DSSC4(K−2), DSSC4(K−1), and DSSC4(K) can be sequentially operated to output the corresponding dummy fourth scan signals DSC4(K−2), DSC4(K−1), and DSC4(K).

The dummy fourth scan signals DSC4(K−3) to DSC4(K) generated in this manner can be output prior to the first fourth scan signal SC4(1), and can have a scan pulse DP4 substantially identical to the scan pulse P4 of the fourth scan signals SC4.

For example, the dummy fourth scan signals DSC4(K−3) to DSC4(K) can have the same pulse period Pi as the fourth scan signals SC4, and an interval of the pulse period Pi can be provided between the K-th dummy fourth scan signal DSC4(K) and the first fourth scan signal SC4(1). In addition, the dummy fourth scan signals DSC4(K−3) to DSC4(K) can have the same second pulse width Pw2 as the fourth scan signals SC4.

Therefore, the dummy fourth scan signals DSC4 and the fourth scan signals SC4 can be considered as scan signals of the same waveform that are output at regular intervals or sequentially, when viewed as a whole.

As above, the falling edge of the scan pulse DP4 of each of the four dummy fourth scan signals DSC4(K−3) to DSC4(K) output in the final scan section of the dummy scan region DSA can match the rising edge of the scan pulse P4 of each of the four fourth scan signals SC4(1) to SC4(4) in the initial scan section of the display region AA.

In this regard, the falling edge of the K−3-th dummy fourth scan signal DSC4(K−3) can be positioned at the same time as the rising edge of the first fourth scan signal SC4(1). In addition, the falling edge of the K−2-th dummy fourth scan signal DSC4(K−2) can be positioned at the same time as the rising edge of the second fourth scan signal SC4(2). In addition, the falling edge of the K−1-th dummy fourth scan signal DSC4(K−1) can be positioned at the same time as the rising edge of the third fourth scan signal SC4(3). In addition, the falling edge of the K-th dummy fourth scan signal DSC4(K) can be positioned at the same time as the rising edge of the fourth fourth scan signal SC4(4).

Therefore, the rising edges of the fourth scan signals SC4(1) to SC4(4) in the initial scan section of the display region AA can be offset by the dummy fourth scan signal DSC4(K−3) to DSC4(K) in the final scan section of the dummy scan region DSA which can be considered as scan signals preceding them.

Therefore, the ripples RPL in the rising direction that are induced in the anode reset voltage Var electrically coupled with the fourth scan signal SC4(1) to SC4(4) in the initial scan section due to the rising edges of the fourth scan signal SC4(1) to SC4(4) can be offset by the ripples in the falling direction that are induced in the anode reset voltage Var electrically coupled with the dummy fourth scan signal DSC4(K−3) to DSC4(K) in the final dummy scan section due to the falling edges of the dummy fourth scan signal DSC4(K−3) to DSC4(K).

According to the present disclosure, the ripples RPL in the anode reset voltage Var due to the toggling of the fourth scan signals SC4 in the top region of the display region AA, which corresponds to the initial scan section, can be prevented or reduced, so that the occurrence of the mura MR at the portion of the display region AA, to which the third scan signals SC3 are applied in the initial scan section of the fourth scan signal SC4, due to the ripples RPL in the anode reset voltage Var can be improved.

Similar to the dummy first scan signal DSC1 described above, the rising edge of the dummy fourth scan signal DSC4 that cancels out the fourth scan signal SC4 in the initial scan section can be located within the blank BLK between adjacent frames FR. In this regard, as mentioned above, the blank BLK between the frames FR can be a section that has little influence on the driving of the display panel 100, so that when the rising edge of the dummy fourth scan signal DSC4 is located within the blank BLK, its influence on the driving characteristics of the display panel 100 can be significantly low.

According to the embodiment of the present disclosure, the dummy gate driving portion including the dummy first and fourth scan driving circuits that output the dummy first and fourth scan signals can be formed on the upper side of the gate driving portion, and the timings at which the scan operations of the dummy first and fourth scan signals start can be selected through the dummy stage selection operations by the first and second switch circuits respectively corresponding to the dummy first and fourth scan driving circuits.

Accordingly, each of the dummy first and fourth scan signals having the falling edge opposite in toggling direction to the rising edge of each of the first and fourth scan signals in the initial scan section of the display region that can cause the ripple in the anode reset voltage can be selected and generated.

Therefore, the ripples in the rising direction induced in the anode reset voltage by the rising edges of the first and fourth scan signals in the initial scan section of the display region can be offset by the ripples in the falling direction induced in the anode reset voltage by the falling edges of the dummy first and fourth scan signals in the final dummy scan section.

Therefore, the ripples in the anode reset voltage due to the toggling of the first and fourth scan signals in the top region of the display region, which corresponds to the initial scan section can be prevented or reduced. As a result, the occurrence of the mura due to the ripples in the anode reset voltage in the portion of the display region where the third scan signal is applied in the initial scan section of the first and fourth scan signals can be improved, thereby improving image quality. It is to be noted that although the example embodiments of the present disclosure provide a display apparatus that can prevent or reduce a ripple of the anode reset voltage, but the present disclosure is not limited thereto. For example, any other voltage line such as a line transmitting the initialization voltage Vini or a line transmitting the bias voltage Vobs may also occur a ripple therein through the electrical coupling between such voltage line and the scan lines, and accordingly, such ripple can also be prevented or reduced in a same or similar manner as that of the anode reset voltage.

The display apparatus according to various embodiments of the present disclosure can be applied to a mobile device, a video phone, a smart watch, a watch phone, a wearable apparatus, a foldable apparatus, a rollable apparatus, a bendable apparatus, a flexible apparatus, a curved apparatus, a sliding apparatus, a variable apparatus, an electronic notebook, an electronic book, a portable multimedia player (PMP), a personal digital assistant (PDA), an MP3 player, a mobile medical apparatus, a desktop PC, a laptop PC, a netbook computer, a workstation, a navigation system, a vehicle navigation system, a vehicle display apparatus, a vehicle apparatus, a theater apparatus, a theater display apparatus, a television, a wallpaper apparatus, a signage apparatus, a game apparatus, a notebook, a monitor, a camera, a camcorder, and home appliances.

A display apparatus according to various embodiments of the present disclosure can be described as follows.

According to an embodiment, a display apparatus can include a display panel including a display region in which a plurality of pixels are arranged, and a dummy scan region outside the display region; a plurality of first scan lines respectively arranged in a plurality of horizontal lines of the display region; a plurality of first scan stages respectively connected to the plurality of first scan lines; K dummy first scan lines respectively arranged in K horizontal lines of the dummy scan region, and each transmitting a dummy first scan signal, where K is a positive integer; and K dummy first scan stages respectively connected to the K dummy first scan lines, and the dummy first scan signal precedes a first scan signal of a first horizontal line among the plurality of horizontal lines.

According to an embodiment, a voltage line transmitting an anode reset voltage can be adjacent to the first scan line and the dummy first scan line, an end edge of a scan pulse of the first scan signal of the first horizontal line can coincide with a start edge of the scan pulse of the first scan signal of an m-th horizontal line, where m is a positive integer which is equal to or smaller than K, and K−m+1-th to K-th dummy first scan stages can be activated to output the dummy first scan signal.

According to an embodiment, an electrical coupling can occur between the voltage line and each of the first scan line and the dummy first scan line.

According to an embodiment, the display apparatus can further include a light emitting diode, a first transistor connected to the light emitting diode, a second transistor connected to the first transistor, and a third transistor connected to the light emitting diode disposed in each pixel of the plurality of pixels, and the first scan line can transmit the first scan signal to the second transistor.

According to an embodiment, the anode reset voltage can be applied to an anode electrode of the light emitting diode through the third transistor. According to an embodiment, the display apparatus can further include a fourth transistor disposed in the each pixel and providing an initialization voltage to the first transistor; a plurality of fourth scan lines respectively arranged in the plurality of horizontal lines of the display region and each transmitting a fourth scan signal to the fourth transistor; a plurality of fourth scan stages respectively connected to the plurality of fourth scan lines; K dummy fourth scan lines respectively arranged in the K horizontal lines of the dummy scan region and each transmitting a dummy fourth scan signal; and K dummy fourth scan stages respectively connected to the K dummy fourth scan lines, the voltage line can be adjacent to the fourth scan line and the dummy fourth scan line such that an electrical coupling occurs between the voltage line and each of the fourth scan line and the dummy fourth scan line, the dummy fourth scan signal can precede the fourth scan signal of the first horizontal line, an end edge of a scan pulse of the fourth scan signal of the first horizontal line can coincide with a start edge of the scan pulse of the fourth scan signal of an h-th horizontal line, where h is a positive integer which is equal to or smaller than K, and K−h+1-th to K-th dummy fourth scan stages can be activated to output the dummy fourth scan signal.

According to an embodiment, the display apparatus can further include a first switch circuit including K first switches provided with a dummy first scan start signal and respectively connected to the K dummy first scan stages, and the first switch connected to the K−m+1-th dummy first scan stage can be turned on to input the dummy first scan start signal to the K−m+1-th dummy first scan stage.

According to an embodiment, the display apparatus can further include a second switch circuit including K second switches provided with a dummy fourth scan start signal and respectively connected to the K dummy fourth scan stages, and the second switch connected to the K−h+1-th dummy fourth scan stage can be turned on to input the dummy fourth scan start signal to the K−h+1-th dummy fourth scan stage According to an embodiment, the end edge of the scan pulse of the dummy first scan signal of each of the K−m+1-th to K-th dummy first scan stages can coincide with the start edge of the scan pulse of the first scan signal of each of first to m-th first scan stages respectively, and the start edge of the scan pulse of the dummy first scan signal of each of the K−m+1-th to K-th dummy first scan stages can be located within a blank between adjacent frames.

According to an embodiment, the end edge of the scan pulse of the dummy fourth scan signal of each of the K−h+1-th to K-th dummy fourth scan stages can coincide with the start edge of the scan pulse of the fourth scan signal of each of first to h-th dummy fourth scan stages respectively, and the start edge of the scan pulse of the dummy fourth scan signal of each of the K−h+1-th to K-th dummy fourth scan stages can be located within a blank between adjacent frames.

According to an embodiment, a frame period of the horizontal line of the display region can include a first period and a second period, the first and fourth scan signals can be output in the first period, and a third scan signal, which is applied to the third transistor, can be output in each of the first period and the second period.

According to an embodiment, the first scan stage, the fourth scan stage, the dummy first scan stage, and the dummy fourth scan stage can be configured in a GIP structure in a non-display region horizontally outside the display region.

According to an embodiment, one of the first to fourth transistors can be formed of one or a combination of an oxide semiconductor layer, a polycrystalline silicon semiconductor layer, and a low temperature polycrystalline silicon semiconductor layer.

According to an embodiment, a display apparatus can include a display panel including a display region and a dummy scan region outside the display region; a first scan stage outputting a first scan signal applied to a pixel in the display region; and a dummy first scan stage outputting a dummy first scan signal having same pulse period as the first scan signal, to the dummy scan region, wherein the dummy first scan signal precedes the first scan signal of a first horizontal line, wherein for a scan pulse of the first scan signal, an end edge and a start edge are positioned at the same time at an interval of m horizontal lines, and wherein among a plurality of dummy first scan stages, m dummy first scan stages from a last dummy first scan stage are activated to output the dummy first scan signal with the same interval of m horizontal lines.

According to an embodiment, the pixel can include a light emitting diode, a first transistor, a second transistor connected to the first transistor, and a third transistor connected to an anode electrode of the light emitting diode, and the first scan signal can be applied to the second transistor.

According to an embodiment, the display apparatus can further include a fourth transistor disposed in the pixel and providing an initialization voltage to the first transistor; a fourth scan stage outputting a fourth scan signal applied to the fourth transistor; and a dummy fourth scan stage outputting a dummy fourth scan signal to the dummy scan region, the dummy fourth scan signal can precede the fourth scan signal of the first horizontal line, for a scan pulse of the fourth scan signal, an end edge and a start edge can be positioned at the same time at an interval of h horizontal lines, and among a plurality of dummy fourth scan stages, h dummy fourth scan stages from a last dummy fourth scan stage can be activated to output the dummy fourth scan signal.

According to an embodiment, the display apparatus can further include a first switch circuit including a first switch provided with a dummy first scan start signal and connected to each of the plurality of dummy first scan stages, and the first switch connected to an m-th dummy first scan stage from the last dummy first scan stage can be turned on to input the dummy first scan start signal to the m-th dummy first scan stage from the last dummy first scan stage.

According to an embodiment, the display apparatus can further include a second switch circuit including a second switch provided with a dummy fourth scan start signal and connected to each of the plurality of dummy fourth scan stages, and the second switch connected to an h-th dummy fourth scan stage from the last dummy fourth scan stage can be turned on to input the dummy fourth scan start signal to the h-th dummy fourth scan stage from the last dummy fourth scan stage.

According to an embodiment, an end edge of a scan pulse of the dummy first scan signal of an m-th dummy first scan stage from the last dummy first scan stage can coincide with the start edge of the scan pulse of the first scan signal of a first first scan stage.

According to an embodiment, a start edge of a scan pulse of the dummy first scan signal of each of the m dummy first scan stages from the last dummy first scan stage can be located within a blank between adjacent frames.

According to an embodiment, an end edge of a scan pulse of the dummy fourth scan signal of an h-th dummy fourth scan stage from the last dummy fourth scan stage can coincide with the start edge of the scan pulse of the fourth scan signal of a first fourth scan stage.

According to an embodiment, a start edge of a scan pulse of the dummy fourth scan signal of each of the h dummy fourth scan stages from the last dummy fourth scan stage can be located within a blank between adjacent frames.

According to an embodiment, a frame period of the horizontal line of the display region can include a first period and a second period, and the first and fourth scan signals are output in the first period, and a third scan signal, which is applied to the third transistor, can be output in each of the first period and the second period.

According to an embodiment, the first scan stage, the fourth scan stage, the dummy first scan stage, and the dummy fourth scan stage can be configured in a GIP structure in a non-display region horizontally outside the display region.

According to an embodiment, one of the first to fourth transistors can be formed of one or a combination of an oxide semiconductor layer, a polycrystalline silicon semiconductor layer, and a low temperature polycrystalline silicon semiconductor layer.

According to an embodiment, a display apparatus can include a display panel including a display region in which a plurality of pixels are arranged, and a dummy scan region adjacent to the display region; a gate driving circuit configured to supply first scan signals to a plurality of first scan lines respectively arranged in a plurality of horizontal lines of the display region; and a dummy driving circuit configured to supply at least one dummy first scan signal to dummy first scan lines respectively arranged in the dummy scan region, wherein the at least one dummy first scan signal precedes a first scan signal of a first horizontal line among the plurality of horizontal lines, and wherein the at least one dummy first scan signal and the first scan signals are scan signals of a same waveform that are sequentially output at a same interval.

It will be apparent to those skilled in the art that various modifications and variation can be made in the present disclosure without departing from the technical idea or scope of the disclosure. Thus, it is intended that the present disclosure cover the modifications and variations of this disclosure provided they come within the scope of the appended claims and their equivalents. Therefore, the scope of protection of the present disclosure should be construed based on the following claims, and all technical features within the scope of equivalents thereof should be construed as being included within the scope of the present disclosure.

What is claimed is:

1. A display apparatus, comprising:
   a display panel including a display region in which a plurality of pixels are arranged, and a dummy scan region outside the display region;
   a plurality of first scan lines respectively arranged in a plurality of horizontal lines of the display region;
   a plurality of first scan stages respectively connected to the plurality of first scan lines;
   K dummy first scan lines respectively arranged in K horizontal lines of the dummy scan region, and each for transmitting a dummy first scan signal, where K is a positive integer; and
   K dummy first scan stages respectively connected to the K dummy first scan lines,
   wherein the dummy first scan signal precedes a first scan signal of a first horizontal line among the plurality of horizontal lines.

2. The display apparatus of claim 1, wherein a voltage line for transmitting an anode reset voltage is adjacent to a first scan line and a dummy first scan line,
   wherein an end edge of a scan pulse of the first scan signal of the first horizontal line coincides with a start edge of the scan pulse of the first scan signal of an m-th horizontal line, where m is a positive integer which is equal to or smaller than K, wherein K−m+1-th to K-th dummy first scan stages are configured to be activated to output the dummy first scan signal, wherein the first scan line is a line among the plurality of first scan lines, wherein the dummy first scan line is a line among the K dummy first scan lines, and wherein the m-th horizontal line is a line among the plurality of horizontal lines.

3. The display apparatus of claim 2, wherein an electrical coupling is to occur between the voltage line and each of the first scan line and the dummy first scan line.

4. The display apparatus of claim 2, further comprising a light emitting diode, a first transistor connected to the light emitting diode, a second transistor connected to the first transistor, and a third transistor connected to the light emitting diode, which are disposed in each pixel of the plurality of pixels, wherein the first scan line is configured to transmit the first scan signal to the second transistor.

5. The display apparatus of claim 4, wherein the anode reset voltage is applied to an anode electrode of the light emitting diode through the third transistor.

6. The display apparatus of claim 4, further comprising:
a fourth transistor disposed in the each pixel and for providing an initialization voltage to the first transistor;
a plurality of fourth scan lines respectively arranged in the plurality of horizontal lines of the display region and each for transmitting a fourth scan signal to the fourth transistor;
a plurality of fourth scan stages respectively connected to the plurality of fourth scan lines;
K dummy fourth scan lines respectively arranged in the K horizontal lines of the dummy scan region and each for transmitting a dummy fourth scan signal; and
K dummy fourth scan stages respectively connected to the K dummy fourth scan lines, wherein the voltage line is adjacent to a fourth scan line and a dummy fourth scan line such that an electrical coupling is to occur between the voltage line and each of the fourth scan line and the dummy fourth scan line, wherein the dummy fourth scan signal precedes the fourth scan signal of the first horizontal line, wherein an end edge of a scan pulse of the fourth scan signal of the first horizontal line coincides with a start edge of the scan pulse of the fourth scan signal of an h-th horizontal line, where h is a positive integer which is equal to or smaller than K, wherein K−h+1-th to K-th dummy fourth scan stages are configured to be activated to output the dummy fourth scan signal, wherein the fourth scan line is a line among the plurality of fourth scan lines, wherein the dummy fourth scan line is a line among the K dummy fourth scan lines, and wherein the h-th horizontal line is a line among the plurality of horizontal lines.

7. The display apparatus of claim 2, further comprising a first switch circuit including K first switches provided with a dummy first scan start signal and respectively connected to the K dummy first scan stages, wherein a first switch connected to the K−m+1-th dummy first scan stage is configured to be turned on to input the dummy first scan start signal to the K−m+1-th dummy first scan stage, and wherein the first switch is a switch among the K first switches.

8. The display apparatus of claim 6, further comprising a second switch circuit including K second switches provided with a dummy fourth scan start signal and respectively connected to the K dummy fourth scan stages, wherein a second switch connected to the K−h+1-th dummy fourth scan stage is configured to be turned on to input the dummy fourth scan start signal to the K−h+1-th dummy fourth scan stage, and wherein the second switch is a switch among the K second switches.

9. The display apparatus of claim 2, wherein the end edge of the scan pulse of the dummy first scan signal of each of the K−m+1-th to K-th dummy first scan stages coincides with the start edge of the scan pulse of the first scan signal of each of first to m-th first scan stages respectively, and wherein the start edge of the scan pulse of the dummy first scan signal of each of the K−m+1-th to K-th dummy first scan stages is located within a blank between adjacent frames.

10. The display apparatus of claim 6, wherein the end edge of the scan pulse of the dummy fourth scan signal of each of the K−h+1-th to K-th dummy fourth scan stages coincides with the start edge of the scan pulse of the fourth scan signal of each of first to h-th dummy fourth scan stages respectively, and wherein the start edge of the scan pulse of the dummy fourth scan signal of each of the K−h+1-th to K-th dummy fourth scan stages is located within a blank between adjacent frames.

11. The display apparatus of claim 6, wherein a frame period of a horizontal line of the display region includes a first period and a second period, wherein the first and fourth scan signals are output in the first period, and a third scan signal, which is applied to the third transistor, is output in each of the first period and the second period, and wherein the horizontal line is a line among the plurality of horizontal lines.

12. The display apparatus of claim 6, wherein a first scan stage, a fourth scan stage, a dummy first scan stage, and a dummy fourth scan stage are configured in a gate-in panel structure in a non-display region horizontally outside the display region, wherein the first scan stage is a stage among the plurality of first scan stages, wherein the fourth scan stage is a stage among the plurality of fourth scan stages, wherein the dummy first scan stage is a stage among the K dummy first scan stages, and wherein the dummy fourth scan stage is a stage among the K dummy fourth scan stages.

13. The display apparatus of claim 6, wherein one of the first to fourth transistors is formed of one or a combination of an oxide semiconductor layer, a polycrystalline silicon semiconductor layer, and a low temperature polycrystalline silicon semiconductor layer.

14. A display apparatus, comprising:
a display panel including a display region and a dummy scan region outside the display region;
a first scan stage for outputting a first scan signal applied to a pixel in the display region; and
a dummy first scan stage for outputting a dummy first scan signal having a same pulse period as the first scan signal, to the dummy scan region, wherein the dummy first scan signal precedes the first scan signal of a first horizontal line, wherein for a scan pulse of the first scan signal, an end edge and a start edge are positioned at a same time at an interval of m horizontal lines, wherein among a plurality of dummy first scan stages, m dummy first scan stages from a last dummy first scan stage are configured to be activated to output the dummy first scan signal with the same interval of the m horizontal lines, and wherein m is a positive integer.

15. The display apparatus of claim 14, wherein the pixel includes a light emitting diode, a first transistor, a second transistor connected to the first transistor, and a third transistor connected to an anode electrode of the light emitting diode, and wherein the first scan signal is applied to the second transistor.

16. The display apparatus of claim 15, further comprising a fourth transistor disposed in the pixel and for providing an initialization voltage to the first transistor;

a fourth scan stage for outputting a fourth scan signal applied to the fourth transistor; and a dummy fourth scan stage for outputting a dummy fourth scan signal to the dummy scan region, wherein the dummy fourth scan signal precedes the fourth scan signal of the first horizontal line, wherein for a scan pulse of the fourth scan signal, an end edge and a start edge are positioned at a same time at an interval of h horizontal lines, wherein among a plurality of dummy fourth scan stages, h dummy fourth scan stages from a last dummy fourth scan stage are configured to be activated to output the dummy fourth scan signal, and wherein h is a positive integer.

17. The display apparatus of claim 14, further comprising a first switch circuit including a first switch provided with a dummy first scan start signal and connected to each of the plurality of dummy first scan stages, wherein the first switch connected to an m-th dummy first scan stage from the last dummy first scan stage is configured to be turned on to input the dummy first scan start signal to the m-th dummy first scan stage from the last dummy first scan stage.

18. The display apparatus of claim 16, further comprising a second switch circuit including a second switch for being provided with a dummy fourth scan start signal and connected to each of the plurality of dummy fourth scan stages, wherein the second switch connected to an h-th dummy fourth scan stage from the last dummy fourth scan stage is configured to be turned on to input the dummy fourth scan start signal to the h-th dummy fourth scan stage from the last dummy fourth scan stage.

19. The display apparatus of claim 14, wherein an end edge of a scan pulse of the dummy first scan signal of an m-th dummy first scan stage from the last dummy first scan stage coincides with the start edge of the scan pulse of the first scan signal of a first first scan stage.

20. The display apparatus of claim 14, wherein a start edge of a scan pulse of the dummy first scan signal of each of the m dummy first scan stages from the last dummy first scan stage is located within a blank between adjacent frames.

21. The display apparatus of claim 16, wherein an end edge of a scan pulse of the dummy fourth scan signal of an h-th dummy fourth scan stage from the last dummy fourth scan stage coincides with the start edge of the scan pulse of the fourth scan signal of a first fourth scan stage.

22. The display apparatus of claim 16, wherein a start edge of a scan pulse of the dummy fourth scan signal of each of the h dummy fourth scan stages from the last dummy fourth scan stage is located within a blank between adjacent frames.

23. The display apparatus of claim 16, wherein a frame period of a horizontal line of the display region includes a first period and a second period, and wherein the first and fourth scan signals are output in the first period, and a third scan signal, which is applied to the third transistor, is output in each of the first period and the second period.

24. The display apparatus of claim 16, wherein the first scan stage, the fourth scan stage, the dummy first scan stage, and the dummy fourth scan stage are configured in a gate-in panel structure in a non-display region horizontally outside the display region.

25. The display apparatus of claim 16, wherein one of the first to fourth transistors is formed of one or a combination of an oxide semiconductor layer, a polycrystalline silicon semiconductor layer, and a low temperature polycrystalline silicon semiconductor layer.

26. A display apparatus, comprising:

a display panel including a display region in which a plurality of pixels are arranged, and a dummy scan region adjacent to the display region;

a gate driving circuit configured to supply first scan signals to a plurality of first scan lines respectively arranged in a plurality of horizontal lines of the display region; and a dummy driving circuit configured to supply at least one dummy first scan signal to dummy first scan lines respectively arranged in the dummy scan region, wherein the at least one dummy first scan signal precedes a first scan signal of a first horizontal line among the plurality of horizontal lines, and wherein the at least one dummy first scan signal and the first scan signals are scan signals of a same waveform that are sequentially output at a same interval.

* * * * *